US012772689B2

(12) United States Patent
Kil et al.

(10) Patent No.: US 12,772,689 B2
(45) Date of Patent: Oct. 20, 2026

(54) DISPLAY DEVICE

(71) Applicant: LG DISPLAY CO., LTD., Seoul (KR)

(72) Inventors: Moon Sung Kil, Paju si (KR); Eun Hyung Lee, Paju si (KR); Ju Won Oh, Paju si (KR)

(73) Assignee: LG DISPLAY CO., LTD., Seoul (KR)

( * ) Notice: Subject to any disclaimer, the term of this patent is extended or adjusted under 35 U.S.C. 154(b) by 470 days.

(21) Appl. No.: 18/454,500

(22) Filed: Aug. 23, 2023

(65) Prior Publication Data

US 2024/0215370 A1 Jun. 27, 2024

(30) Foreign Application Priority Data

Dec. 23, 2022 (KR) ........................ 10-2022-0182450

(51) Int. Cl.

*H10K 59/35* (2023.01)
*H10K 59/65* (2023.01)
*H10K 102/00* (2023.01)

(52) U.S. Cl.

CPC ........... *H10K 59/353* (2023.02); *H10K 59/65* (2023.02); *H10K 2102/351* (2023.02)

(58) Field of Classification Search

CPC . H10K 59/353; H10K 59/65; H10K 2102/351
See application file for complete search history.

(56) References Cited

U.S. PATENT DOCUMENTS

2015/0090986 A1* 4/2015 Toyoda .................. H10K 59/32 257/40
2016/0118626 A1 4/2016 Seo et al.
2021/0202598 A1* 7/2021 Han ....................... H10K 59/32
2024/0280737 A1* 8/2024 Erickson .................. C12N 9/80
2024/0414997 A1* 12/2024 Yanagisawa ........... H05B 33/22

FOREIGN PATENT DOCUMENTS

| | | | |
|---|---|---|---|
| JP | 2009-53417 | A | 3/2009 |
| JP | 2016-85968 | A | 5/2016 |
| KR | 10-2017-0072728 | A | 6/2017 |
| KR | 10-2021-0017179 | A | 2/2021 |
| KR | 10-2022-0016372 | A | 2/2022 |
| KR | 10-2022-0019154 | A | 2/2022 |
| KR | 10-2362839 | B1 | 2/2022 |

* cited by examiner

*Primary Examiner* — Anne M Hines
(74) *Attorney, Agent, or Firm* — PnK IP LLC

(57) ABSTRACT

A display device includes a display panel configured to include a first display area in which a plurality of first pixels are disposed, and a second display area in which a plurality of second pixels and a light-transmission area between the second pixels are disposed; and a sensor disposed corresponding to the second display area, wherein the second pixel includes a plurality of sub-pixels, the plurality of sub-pixels include a red sub-pixel including a red organic compound layer disposed between a first anode electrode and a first cathode electrode, a green sub-pixel including a green organic compound layer disposed between a second anode electrode and a second cathode electrode, and a blue sub-pixel including a blue organic compound layer disposed between a third anode electrode and a third cathode electrode, and a thickness of the green organic compound layer is larger than thicknesses of the red organic compound layer and the blue organic compound layer.

12 Claims, 17 Drawing Sheets

SD1 : E11, E12, E21, E22

SD1 : E11, E12, E21, E22

DISPLAY DEVICE

CROSS-REFERENCE TO RELATED APPLICATION

This application claims the priority of Korean Patent Application No. 10-2022-0182450, filed on Dec. 23, 2022, which is hereby incorporated by reference in its entirety.

BACKGROUND

Field of the Disclosure

The present disclosure relates to an apparatus and particularly to a display device.

Description of the Background

Electroluminescence display devices may be classified into inorganic light-emitting display devices and organic light-emitting displays according to a material of an emission layer. An active matrix organic light-emitting display device includes an organic light-emitting diode (OLED) that generates light by itself and has advantages in terms of a high response rate, high luminous efficiency, high luminance, and a large viewing angle. In an organic light-emitting display device, an OLED is formed at each pixel. The organic light-emitting display device has a high response rate, high luminous efficiency, high luminance, and a large viewing angle and is capable of expressing black gradation in perfect or near perfect black, thereby achieving a high contrast ratio and a high color reproduction rate.

Here, the light-emitting elements used in the organic light-emitting display are self-emitting elements in which a light-emitting layer is formed between two electrodes, and are elements in which electrons and holes from a cathode for injecting electrons and an anode for injecting holes are injected into the light-emitting layer, such that light is emitted when excitons in which the injected electrons and holes are combined fall from an excited state to a ground state.

Multi-media functions of mobile terminals are being improved. For example, a camera is basically built into a smart phone, and the resolution of the camera is increasing to the level of a conventional digital camera. However, the front camera of the smart phone limits the screen design, thereby making it difficult to design the screen. To reduce the space occupied by the camera, a screen design including a notch or punch hole has been adopted for smart phones, but the screen size is still limited due to the notch or punch hole, thereby making it difficult to implement a full-screen display.

To implement a full-screen display, it is proposed to provide an imaging area with low-resolution pixels within a screen of a display panel, and to dispose electronic components such as a camera and various sensors in a position opposite to the imaging area below the display panel. Here, each of the pixels may include a plurality of sub-pixels.

The description provided in the background section should not be assumed to be prior art merely because it is mentioned in or associated with the background section. The background section may include information that describes one or more aspects of the subject technology.

SUMMARY

As newly recognized by inventors of the present disclosure, when a full screen display is implemented, delayed light emission formed by light-emitting elements and light generated by lateral leakage current cause a limitation in affecting cameras and various sensors. A green sub-pixel implementing green among the light-emitting elements is inferior to other sub-pixels in terms of delayed light emission; this is because a long delay time of the green sub-pixel may act as a factor. Here, it is discovered by the inventors that, the delayed light emission is related to a capacitance.

For example, in the case of a camera, there is a limitation in that image crosstalk distortion occurs due to light generated by the delayed light emission and lateral leakage current. In addition, in the case of an infrared sensor, there is a limitation in that an error occurs in recognizing an object (such as a face) due to light generated by the delayed light emission and lateral leakage current.

Accordingly, the present disclosure to provide a display device that can minimize or reduce an influence of light on a sensor by light generated by the delayed light emission and lateral leakage current.

More specifically, the present disclosure is to provide a display device that can minimize or reduce an influence of light on a sensor by using a green sub-pixel among sub-pixels disposed in a display panel.

The present disclosure is also to provide a display device that can minimize or reduce an influence of light on a sensor by presenting various structures for green sub-pixels.

The present disclosure is not limited to the described above, and other features which are not described above will be clearly understood by those skilled in the art from the following descriptions.

According to an aspect of the present disclosure, a display device includes a display panel configured to include a first display area in which a plurality of first pixels are disposed, and a second display area in which a plurality of second pixels and a light-transmission area between the second pixels are disposed; and a sensor disposed corresponding to the second display area, wherein the second pixel may include a plurality of sub-pixels, the plurality of sub-pixels include at least a red sub-pixel including a red organic compound layer disposed between a first anode electrode and a first cathode electrode, a green sub-pixel including a green organic compound layer disposed between a second anode electrode and a second cathode electrode, and a blue sub-pixel including a blue organic compound layer disposed between a third anode electrode and a third cathode electrode, and a thickness of the green organic compound layer may be larger than thicknesses of each of the red organic compound layer and the blue organic compound layer.

According to another aspect of the present disclosure, a display device includes a display panel configured to include a first display area in which a plurality of first pixels are disposed, and a second display area in which a plurality of second pixels and a light-transmission area between the second pixels are disposed; and a sensor disposed corresponding to the second display area, the second pixel may include a plurality of sub-pixels, wherein the plurality of sub-pixels may include at least a red sub-pixel including a red organic compound layer disposed between a first anode electrode and a first cathode electrode, and a green sub-pixel including a green organic compound layer disposed between a second anode electrode and a second cathode electrode, a blue sub-pixel including a blue organic compound layer disposed between a third anode electrode and a third cathode electrode, a distance between the first anode electrode and the first cathode electrode may be $\lambda/n$, a distance between the second anode electrode and the second cathode electrode may be $3\lambda/2n$, and $\lambda$ may be a wavelength of light emitted from each sub-pixel, and n may be the average refractive index of the organic compound layer disposed in each sub-pixel.

According to yet another aspect of the present disclosure, a display device includes a display panel configured to include a first display area in which a plurality of first pixels are disposed, and a second display area in which a plurality of second pixels and a light-transmission area between the second pixels are disposed; and a sensor disposed corresponding to the second display area, wherein the second pixel may include a plurality of sub-pixels, the plurality of sub-pixels may include at least a red sub-pixel including a red organic compound layer disposed between a first anode electrode and a first cathode electrode, a green sub-pixel including a green organic compound layer disposed between a second anode electrode and a second cathode electrode, and a blue sub-pixel including a blue organic compound layer disposed between a third anode electrode and a third cathode electrode, and the second anode electrode disposed at one side of the green organic compound layer may be disposed to be spaced apart from the first anode electrode or the third anode electrode in a first direction perpendicular to a surface of the display panel.

According to the aspect, an influence of light on a sensor may be minimized or reduced by using a green sub-pixel among sub-pixels disposed in a display panel. In detail, the influence of light on the sensor is minimized or reduced by increasing a thickness of the green sub-pixel or positioning an anode electrode, which is a first electrode of the green sub-pixel, differently from the position of an anode electrode, which is a first electrode of the other sub-pixels.

According to the aspect, various structures for the green sub-pixel related to the influence of light on the sensor may be presented.

According to the aspect, the performance of the sensor may be increased by minimizing or reducing the influence of light on the sensor, and low-power driving of the sensor is enabled.

Various useful advantages and effects of the aspects are not limited to the above-described contents and will be more easily understood from descriptions of the specific aspects.

It is to be understood that both the foregoing general description and the following detailed description are exemplary and explanatory and are intended to provide further explanation of the inventive concepts as claimed.

Additional features and aspects of the disclosure will be set forth in part in the description that follows and in part will become apparent from the description or may be learned by practice of the inventive concepts provided herein. Other features and aspects of the inventive concepts may be realized and attained by the structure particularly structures pointed out in the written description of present disclosure, or derivable therefrom, and the claims hereof as well as the appended drawings.

BRIEF DESCRIPTION OF THE DRAWINGS

The accompanying drawings, that may be included to provide a further understanding of the disclosure and may be incorporated in and constitute a part of the disclosure, illustrate aspects of the disclosure and together with the description serve to explain various principles of the disclosure.

The above and other features and advantages of the present disclosure will become more apparent to those of ordinary skill in the art by describing exemplary aspects thereof in detail with reference to the attached drawings, in which.

Figure 1:
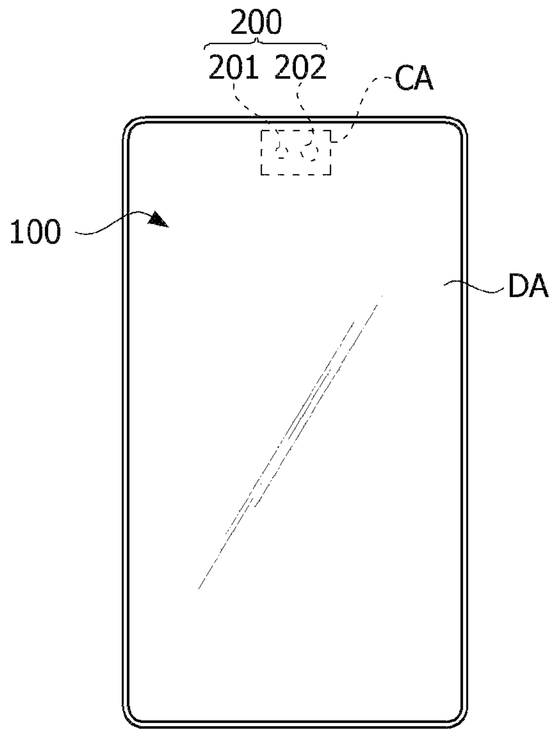
FIG. 1 is an example of a conceptual diagram of a display device according to an exemplary aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure and methods to achieve them will become apparent from the descriptions of aspects herein below with reference to the accompanying drawings. However, the present disclosure is not limited to the aspects disclosed herein but may be implemented in various different forms. The aspects are provided for making the disclosure of the present disclosure thorough and for fully conveying the scope of the present disclosure to those skilled in the art. It is to be noted that the scope of the present disclosure is defined only by the claims.

Shapes, sizes, ratios, angles, numbers, and the like disclosed in the drawings for describing the example aspects of the present disclosure are exemplary, and the present disclosure is not limited to the illustrated items. Like reference numerals refer to like elements throughout. In addition, in describing the present disclosure, if it is determined that the detailed description of the related known technology may unnecessarily obscure the subject matter of the present disclosure, the detailed description thereof will be omitted or may be briefly provided. Any implementation described herein as an "example" is not necessarily to be construed as preferred or advantageous over other implementations.

When "comprise", "include", "have", "consist", or the like mentioned in the present specification, other parts may be added unless "only" is used. In the case where the component is expressed in the singular, the plural includes the plural unless specifically stated otherwise.

In interpreting a component, it is interpreted to include an error range or tolerance range even if there is no separate description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used. In describing a time relationship, for example, when the temporal order is described as, "after," "subsequent," "next," or "before," a case that is not continuous may be included, unless a more limiting term, such as "just," "immediate(ly)," or "direct(ly)," is used.

In the case of the description of the positional relationship, for example, if the positional relationship of the two parts is described as "on," "over," "under," "above," "below," "beneath," "near," "close to," or "adjacent to," "beside," "next, to," or the like, one or more other parts may be located between the two parts unless the term "directly", "closely" or "immediately" is explicitly used. For example, when a structure is described as being positioned "on or above," "over," or "under, or below" "above," "below," "bencath," "near," "close to," or "adjacent to," "beside," or "next to" another structure, this description should be construed as including a case in which the structures contact each other as well as a case in which a third structure is disposed or interposed therebetween. Furthermore, the terms "left," "right," "top," "bottom, "downward," "upward," "upper," "lower," and the like refer to an arbitrary frame of reference.

In the description for the aspects, terms like "first," "second," "A," "B," "(a)," and "(b)," may be used to describe various components, but these components are not limited by these terms. These terms are only used to distinguish one component from another. Therefore, the first component mentioned below may be a second component within the technical idea of the present disclosure.

Where an element or layer is referred to as being "on" or "connected to" another element or layer, it should be understood to mean that the element or layer may be directly on or directly connected to the other element or layer, or that intervening elements or layers may be present. Also, where one element is referred to as being disposed "on" or "under" another element, it should be understood to mean that the elements may be so disposed to directly contact each other, or may be so disposed without directly contacting each other.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The expression of a first element, a second elements "and/or" a third element should be understood as one of the first, second and third elements or as any or all combinations of the first, second and third elements. By way of example, A, B and/or C may refer to only A; only B; only C; any or some combination of A, B, and C; or all of A, B, and C.

Features of various aspects of the present disclosure may be partially or overall coupled to or combined with each other, and may be variously inter-operated with each other and driven technically as those skilled in the art may sufficiently understand. Aspects of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Throughout the specification, the same reference numerals refer to the same component.

The features of each of the various aspects may be coupled or combined with each another, in whole or in part, and various technical interlocking and driving may be possible, and each of the aspects may be implemented independently of each other or in conjunction with each other.

Recently, the importance of a display device as a visual information transmission medium has been further emphasized in information-oriented society, and display devices are being improved to meet requirements, such as low power consumption, reduction of thickness, weight reduction, high definition, high efficiency, and the like.

The display device according to an exemplary aspect of the present disclosure may improve the performance of a sensor by minimizing or reducing the amount of light entering the sensor that adversely affects the sensor based on a light-path changing structure disposed on the inside of a display panel. Accordingly, said display device enables low-power operation as a result of improving the performance of said sensor.

In this case, a green sub-pixel implementing green among the light-emitting elements is inferior to other sub-pixels in terms of delayed light emission; this is because the long delay time of the green sub-pixel may act as a factor. Accordingly, the delayed light emission, which adversely affects the sensor, may be minimized or reduced by means of a structural improvement of the sub-pixel.

Hereinafter, example aspects of the present disclosure will be described in detail with reference to the accompanying drawings.

Figure 2A:
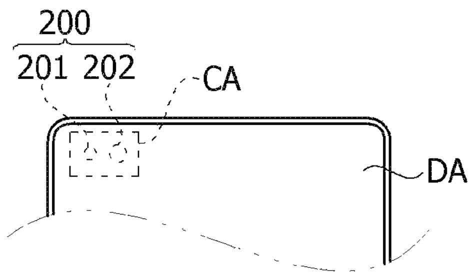
FIGS. 2A to 2D are an example of diagrams illustrating various arrangement positions and shapes of a second display area of a display panel according to an exemplary aspect of the present disclosure.
Figure 2B:
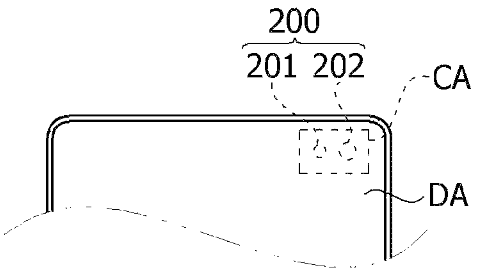
Figure 2C:
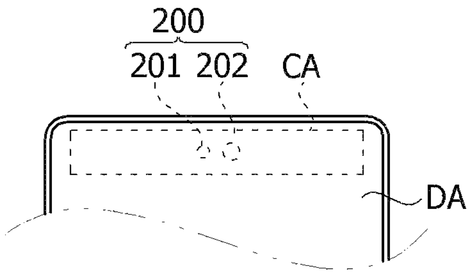
Figure 2D:
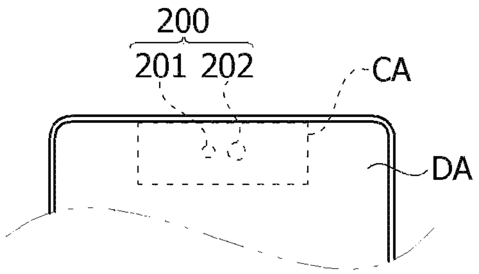
Figure 3:
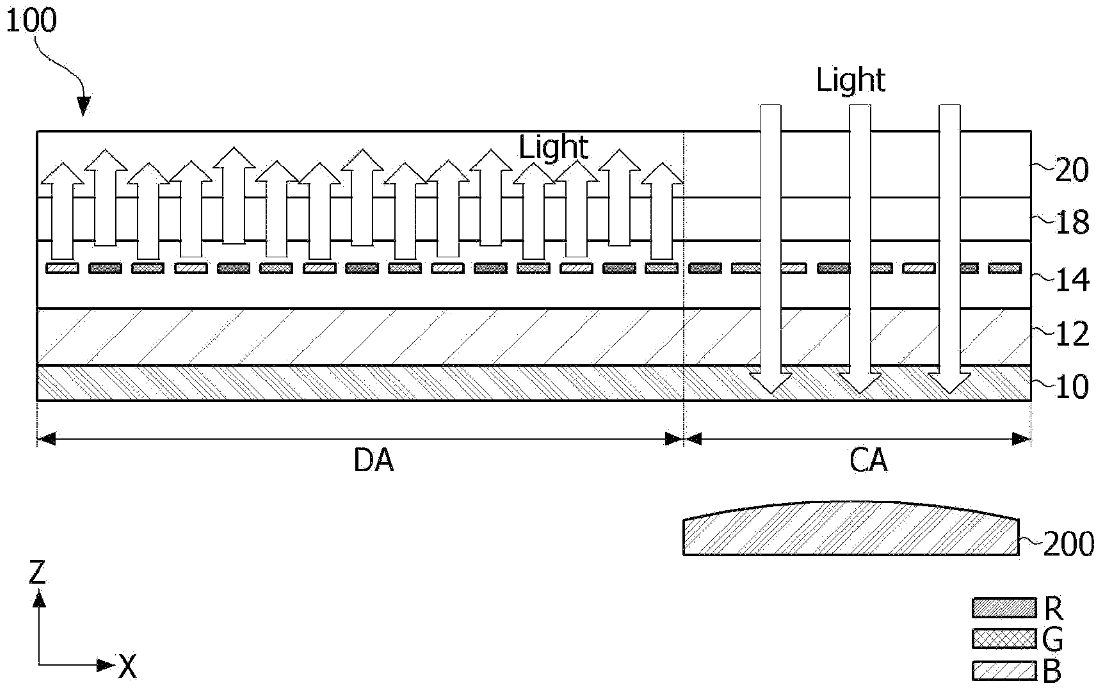
FIG. 3 is an example of a schematic cross-sectional view of a display panel according to an exemplary aspect of the present disclosure.
Figure 4:
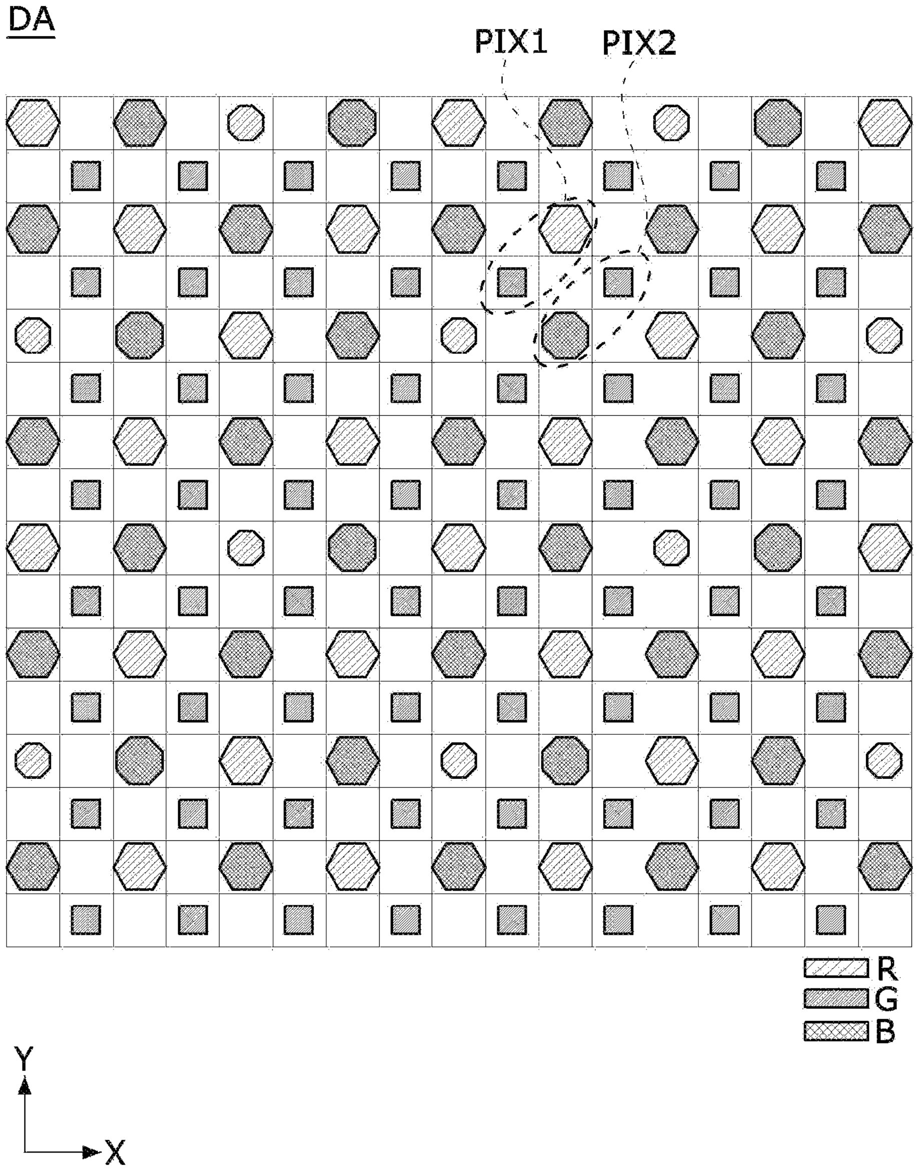
FIG. 4 is an example of a diagram illustrating pixels arranged in a first display area of a display panel according to an exemplary aspect of the present disclosure.

FIG. 1 is a conceptual diagram of a display device according to an exemplary aspect of the present disclosure, FIGS. 2A to 2D are diagrams illustrating various arrangement positions and shapes of a second display area of a display panel according to an exemplary aspect of the present disclosure, FIG. 3 is a schematic cross-sectional view of a display panel according to an exemplary aspect of the present disclosure, and FIG. 4 is a diagram illustrating pixels arranged in a first display area of a display panel according to an exemplary aspect of the present disclosure.

Referring to FIG. 1, a display device according to an exemplary aspect of the present disclosure includes a display panel 100, an optical device 200, and a case, and the entire front surface of the display panel 100 may be implemented as a display area. Accordingly, the display device may implement a full-screen display. Further, the optical device 200 may include an image sensor (or camera), a proximity sensor, a white light illumination device, an optical device for face recognition, and the like.

The display area may include a first display area DA and a second display area CA. Here, both the first display area DA and the second display area CA output images, but may have different resolutions.

For example, the resolution of the plurality of second pixels disposed in the second display area CA may be lower than the resolution of the plurality of first pixels disposed in the first display area DA. A sufficient amount of light may be injected into the sensors 201 and 202 disposed in the second display area CA as much as the resolution of the plurality of second pixels disposed in the second display area CA is lowered. However, it is not necessarily limited thereto, and if the second display area CA has sufficient light transmissivity or an appropriate noise compensation algorithm may be implemented, the resolution of the first display area DA and the resolution of the second display area CA may be the same or substantially same. For example, one or more of the sensors 201 and 202 may at least partially overlap with the second display area CA.

The second display area CA may be an area where the sensors 201 and 202 are disposed. Since the second display area CA is an area overlapping with various sensors, it may have a smaller area than the first display area DA, which outputs most of the image. For the expression that an element or layer "contacts," "overlaps," or the like with another element or layer, the element or layer may not only directly contact, overlap, or the like with another element or layer, but also indirectly contact, overlap, or the like with another element or layer with one or more intervening elements or layers disposed or interposed between the elements or layers, unless otherwise specified.

The sensors 201 and 202 may include at least one of an image sensor, a proximity sensor, an illuminance sensor, a gesture sensor, a motion sensor, a fingerprint recognition sensor, and a biometric sensor. Illustratively, the first sensor 201 may be an infrared sensor and the second sensor 202 may be an image sensor that captures images or videos, but is not limited thereto.

Referring to FIGS. 2A to 2D, the second display area CA may be disposed at various positions where light is incident. Illustratively, the second display area CA may be disposed at an upper left side of the display area, as shown in FIG. 2A. In addition, as shown in FIG. 2B, the second display area CA may be disposed on the upper right side of the display area. Further, as shown in FIG. 2C, the second display area CA may be entirely disposed on the top of the display area. In addition, as shown in FIG. 2D, the width of the second display area CA may be variously modified. However, the position of the second display area CA is not necessarily limited to the position shown in FIGS. 2A to 2D. For example, the second display area CA may be disposed in the center or lower end of the display area.

Hereinafter, the first display area DA may be described as a display area and the second display area CA may be described as an imaging area.

Referring to FIGS. 3 and 4, the display area DA and the imaging area CA may include a pixel array in which pixels into which pixel data is written are disposed. The number of pixels per inch (PPI) of the imaging area CA may be lower than that of the display area DA to secure the light transmissivity of the imaging area CA.

The pixel array of the display area DA may include a pixel area (first pixel area) in which a plurality of pixels having a high PPI are disposed. In addition, the pixel array of the imaging area CA may include a pixel area (second pixel area) in which a plurality of pixel groups having a relatively low PPI are disposed by being spaced apart by a light-transmission area. In the imaging area CA, an external light may pass through the display panel 100 through a light-transmission area having high light transmissivity and may be transmitted to a sensor under the display panel 100.

Since both the display area DA and the imaging area CA include pixels, an input image may be reproduced on the display area DA and the imaging area CA.

Each of the pixels of the display area DA and the imaging area CA may include sub-pixels having different colors to implement color of an image. The sub-pixels may include red sub-pixel, green sub-pixel, and blue sub-pixel. Although not shown in the drawings, each of the pixels P may further include a white sub-pixel (hereinafter referred to as "W sub-pixel"). Further, each of the sub-pixels may include a pixel circuit and a light-emitting device OLED. Here, the sub-pixels may be referred to as a first sub-pixel, a second sub-pixel, and a third sub-pixel.

The imaging area CA may include pixels, and the pixels may display an input image by writing pixel data of an input image in a display mode. In this case, since the optical devices 200 are disposed under the rear surface of the display panel 100 to be overlapped with the imaging area CA, the display area of the screen is not limited by the optical devices 200. Accordingly, the display device of the present disclosure may realize a full-screen display by enlarging the display area of the screen and increase the degree of freedom in screen design.

A camera module may be provided as the optical device 200, and the camera module may capture an external image in an imaging mode and output photo or moving image data. A lens of the camera module may face the imaging area CA. In addition, the external light may be incident to a lens of the camera module through the imaging area CA, and the lens may condense light onto an image sensor not shown in the drawings. Accordingly, the camera module may output photo or moving image data by capturing an external image in the imaging mode. The camera module may include a circuit board, an image sensor, a case, an actuator, and a plurality of lenses. However, the present disclosure is not necessarily limited thereto, and various image acquisition devices capable of performing the role of a camera may be selected.

In addition, the camera module provided as the optical device 200 may be an infrared camera including an infrared sensor 201. Here, the infrared camera captures dot beams of infrared wavelengths focused on a person's face. In addition, the infrared camera may generate facial pattern data by converting light of an infrared wavelength passing through the display panel 100 into electrical signals and converting them into digital data. Accordingly, when the infrared-rays irradiated from an infrared illuminator are irradiated to the user's face and the infrared-rays reflected from the face are received by the infrared camera, a biometric authentication module of a host system processes the user's authentication. In this case, the infrared illuminator may enable face recognition even in a dark environment by using a flood illuminator that generates an infrared (IR) flash.

In addition, to secure the light transmissivity, some pixels may be removed from the imaging area CA compared to the display area DA. In addition, a picture quality compensation algorithm to compensate for the luminance and color coordinates of the pixels disposed in the imaging area CA due to the removed pixels may be applied to the display device.

In the present disclosure, low-resolution pixels may be disposed in the imaging area CA. Therefore, since the display area of the screen is not limited due to the camera module, a full-screen display may be implemented.

The display panel 100 has a width in the X-axis direction, a length in the Y-axis direction, and a thickness in the Z-axis direction. Here, the width and length of the display panel 100 may be set to various design values depending on application fields of the display device. In addition, the X-axis direction may mean a width direction or a horizontal direction, the Y-axis direction may mean a longitudinal direction or a vertical direction, and the Z-axis direction may mean a vertical direction, a stacking direction, or a thickness direction. Here, the X-axis direction, the Y-axis direction, and the Z-axis direction may be perpendicular to each other, but may also mean different directions that are not perpendicular to each other. Accordingly, each of the X-axis direction, the Y-axis direction, and the Z-axis direction may be described as one of a first direction, a second direction, or a third direction. Further, the plane extended in the X-axis direction and the Y-axis direction may mean a horizontal plane.

The display panel 100 may include a circuit layer 12 disposed on the substrate 10 and a light-emitting element layer 14 disposed on the circuit layer 12. In addition, the display panel 100 may include an encapsulation layer 16 disposed on the light-emitting element layer 14, a touch sensor layer 18 disposed on the encapsulation layer 16 and a color filter layer 20 disposed on the touch sensor layer 18. The encapsulation layer may be formed of an inorganic material such as silicon nitride (SiNx), silicon oxynitride (SiNxOy) and aluminum oxide (AlyOz), but is not limited thereto.

The substrate 10 may be formed of an insulating material or a material having flexibility. For example, the substrate 10 may be made of glass, metal, or plastic, but is not limited thereto.

The circuit layer 12 may include a pixel circuit connected to wirings such as data lines, gate lines, and power lines, a gate driver connected to the gate lines, and the like. Further, the circuit layer 12 may include transistors implemented with thin film transistors (TFTs) and circuit elements such as capacitors or the like. Here, the wirings and circuit elements of the circuit layer 12 may be implemented with a plurality of insulating layers, two or more metal layers separated with the insulating layer interposed therebetween, and an active layer including a semiconductor material.

The light-emitting element layer 14 may include a light-emitting element driven by a pixel circuit. Here, the light-emitting element may be implemented with an organic light-emitting diode (OLED). The OLED may include an organic compound layer formed between an anode and a cathode. The organic compound layer includes a hole injection layer (HIL), a hole transport layer (HTL), an emission layer (EML), an electron transport layer (ETL), and an electron injection layer (EIL), but is not limited thereto. When a voltage is applied to an anode and an cathode of the OLED, the holes passing through the hole transport layer (HTL) and the electrons passing through the electron transport layer (ETL) may be moved to the light-emitting layer (EML) to form excitons and emit visible light from the light-emitting layer (EML). However, the present disclosure is not limited thereto. For example, the light-emitting element layer may also be implemented as an inorganic light emitting device layer such as micro-LED.

The light-emitting element layer 14 may further include a color filter array disposed on the pixels to selectively transmit red, green, and blue wavelengths.

The light-emitting element layer 14 may be covered by a protective film, and the protective film may be covered by an encapsulation layer. Here, the protective film may have a structure in which organic films and inorganic films are alternately stacked. In this case, the inorganic film may block penetration of moisture or oxygen. In addition, the organic film may planarize the surface of the inorganic film. When the organic film and the inorganic film are stacked in multiple layers, a movement path of moisture or oxygen is longer than that of a single layer, so that the penetration of moisture/oxygen affecting the light-emitting element layer 14 may be effectively blocked.

The encapsulation layer 16 may cover the light-emitting element layer 14 to seal the circuit layer 12 and the light-emitting element layer 14. Here, the encapsulation layer 16 may have a multi-insulation film structure in which the organic film and the inorganic film are alternately stacked. In this case, the inorganic film blocks penetration of moisture or oxygen. In addition, the organic film planarizes the surface of the inorganic film. When the organic film and the inorganic film are stacked in multiple layers, the movement path of moisture or oxygen is longer than that of a single layer, so that the penetration of moisture/oxygen affecting the light-emitting element layer 14 may be effectively blocked.

The touch sensor layer 18 may include capacitive touch sensors that sense a touch input based on a change in capacitance before and after the touch input. The touch sensor layer 18 may include metal wiring patterns and insulating films forming capacitance of the touch sensors. The insulating films may insulate portions in which the metal wiring patterns are intersected and planarize the surface of the touch sensor layer.

A polarizing plate not shown in the drawing may be adhered on the touch sensor layer 18. The polarizing plate may improve visibility and contrast ratio by converting polarization of external light reflected by the metal patterns of the circuit layer 12. Here, the polarizing plate may be implemented as a polarizing plate in which a linear polarizing plate and a phase retardation film are bonded together or a circular polarizing plate. Further, a cover glass not shown in the drawings may be adhered on the polarizing plate.

The color filter layer 20 may be formed on the touch sensor layer 18.

The color filter layer 20 may include red, green, and blue color filters. In addition, the color filter layer 20 may further include a black matrix pattern. The color filter layer 20 may absorb some wavelengths of light reflected from the circuit layer 12 to replace the role of a polarizing plate and increase color purity. In this aspect, the color filter layer 20 having higher light transmissivity than that of the polarizing plate may be applied to the display panel 100 to improve the light transmissivity of the display panel 100 and to improve the thickness and flexibility of the display panel 100. A cover glass not shown in the drawings may be adhered on the color filter layer 20.

The color filter layer 20 may include an organic film covering the color filter and the black matrix pattern. An extended portion of the organic film may cover the remaining inorganic film or the substrate 10 in the bezel area, for example, the edge area of the display panel 100.

Referring to FIG. 4, the display area DA may include unit pixels PIX1 and PIX2 arranged in a matrix form. Each of the unit pixels PIX1 and PIX2 may be implemented as a real-type pixel in which R, G, and B sub-pixels of three primary colors are configured as one pixel. Here, a first pixel and a second pixel disposed in the display area may be formed by combining unit pixels PIX1 and PIX2.

Each of the unit pixels PIX1 and PIX2 may further include a W sub-pixel not shown in the drawings. In addition, two sub-pixels may be configured as one pixel by using a sub-pixel rendering algorithm. For example, the first unit pixel PIX1 may be composed of Red and Green sub-pixels, and the second unit pixel PIX2 may be composed of Blue and Green sub-pixels. Insufficient color representation in each of the unit pixels PIX1 and PIX2 may be compensated for by an average value of corresponding color data between pixels adjacent to each other. It is to be noted that, although FIGS. 3 and 4 show an example arrangement of the sub-pixels of the display device, the present disclosure is not limited thereto. For example, various other arrangement of the sub-pixels such as real color type are also possible.

Figure 5A:
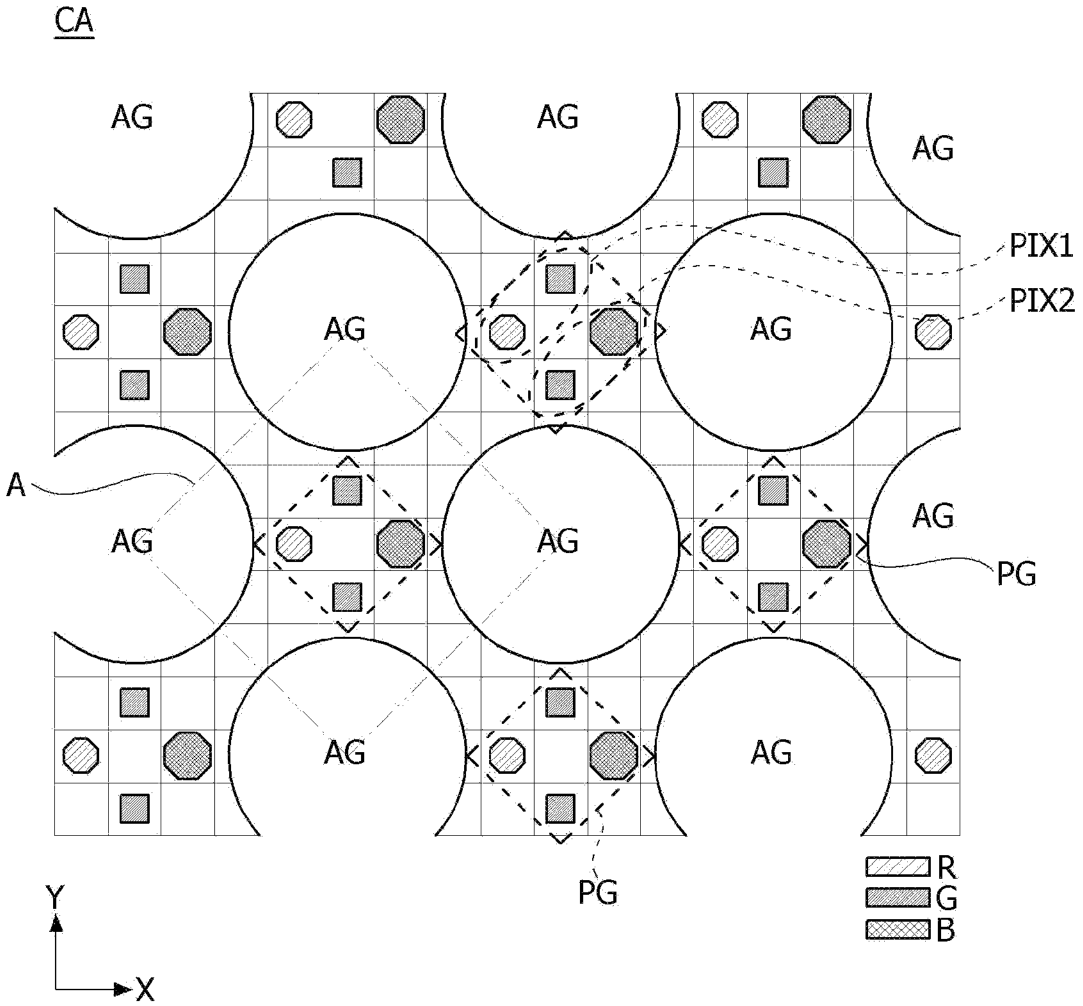
FIG. 5A is an example of a diagram illustrating pixels disposed in a second display area of a display panel and a light-transmission area according to an exemplary aspect of the present disclosure.
Figure 5B:
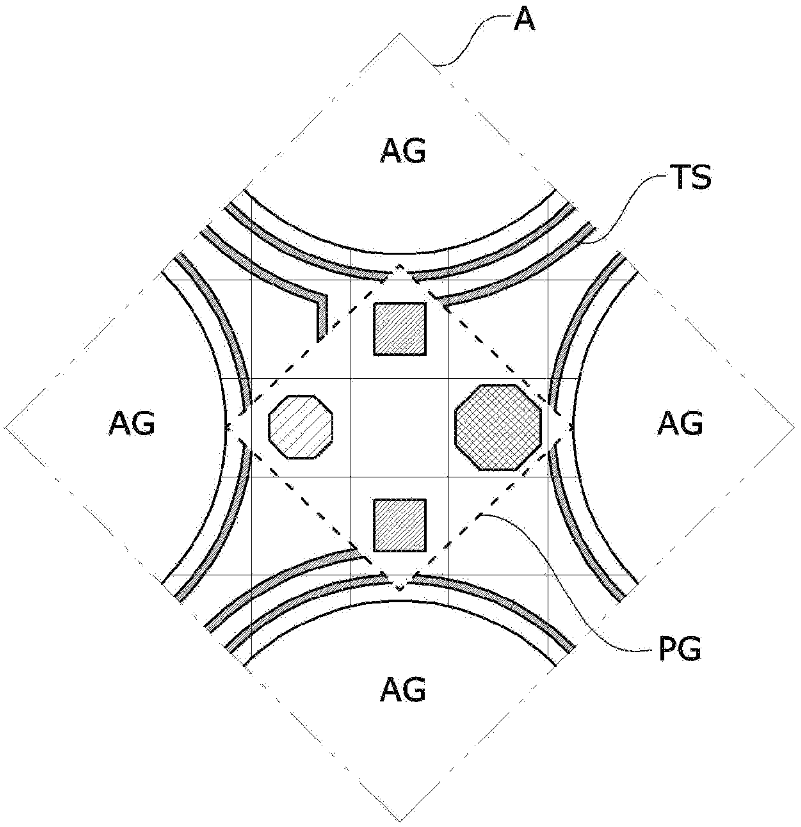
FIG. 5B is an example of a diagram illustrating an enlarged view of a portion A in FIG. 5A.

FIG. 5A is a diagram illustrating pixels disposed in a second display area of a display panel and a light-transmission area according to an exemplary aspect of the present disclosure, and FIG. 5B is an enlarged view of a portion A in FIG. 5A.

Referring to FIGS. 5A and 5B, a plurality of light-transmission area areas AG may be disposed between a plurality of second pixels. In detail, an imaging area CA may include pixel groups PG spaced apart by a predetermined distance D1 and the light-transmission area AG disposed between the pixel groups PG adjacent to each other. The external light may be received by a lens of the camera module through the light-transmission area AG. The pixel groups PG may be spaced apart from each other within the pixel area.

The light-transmission area AG may include transparent materials having high light transmissivity without metal so that light may be incident with minimal or reduced light loss. The light-transmission area AG may be made of transparent insulating materials without including metal wirings or pixels. Accordingly, the light transmissivity of the imaging area CA may increase as the light-transmission area AG is larger.

One or two pixels may be included in the pixel group PG. Each of the pixels of the pixel group may include two to four sub-pixels. For example, one pixel in the pixel group may include Red, Green, and Blue sub-pixels or two sub-pixels, and may further include a W sub-pixel.

A distance between the light-transmission areas AG may be smaller than an interval (pitch) between the pixel groups PG. An interval between sub-pixels may be smaller than the interval between the pixel groups PG.

The shape of the light-transmission area AG is illustrated as circular, but is not limited thereto. For example, the light-transmission area AG may be designed in various shapes such as a circular shape, an elliptical shape, and a polygonal shape.

All of the metal electrode material in the light-transmission area AG may be removed. Accordingly, the wirings TS of the pixels may be disposed outside the light-transmission area AG. Therefore, light may be effectively incident through the light-transmission area AG. However, it is not necessarily limited thereto, and a metal electrode material may remain in some areas of the light-transmission area AG.

Figure 6:
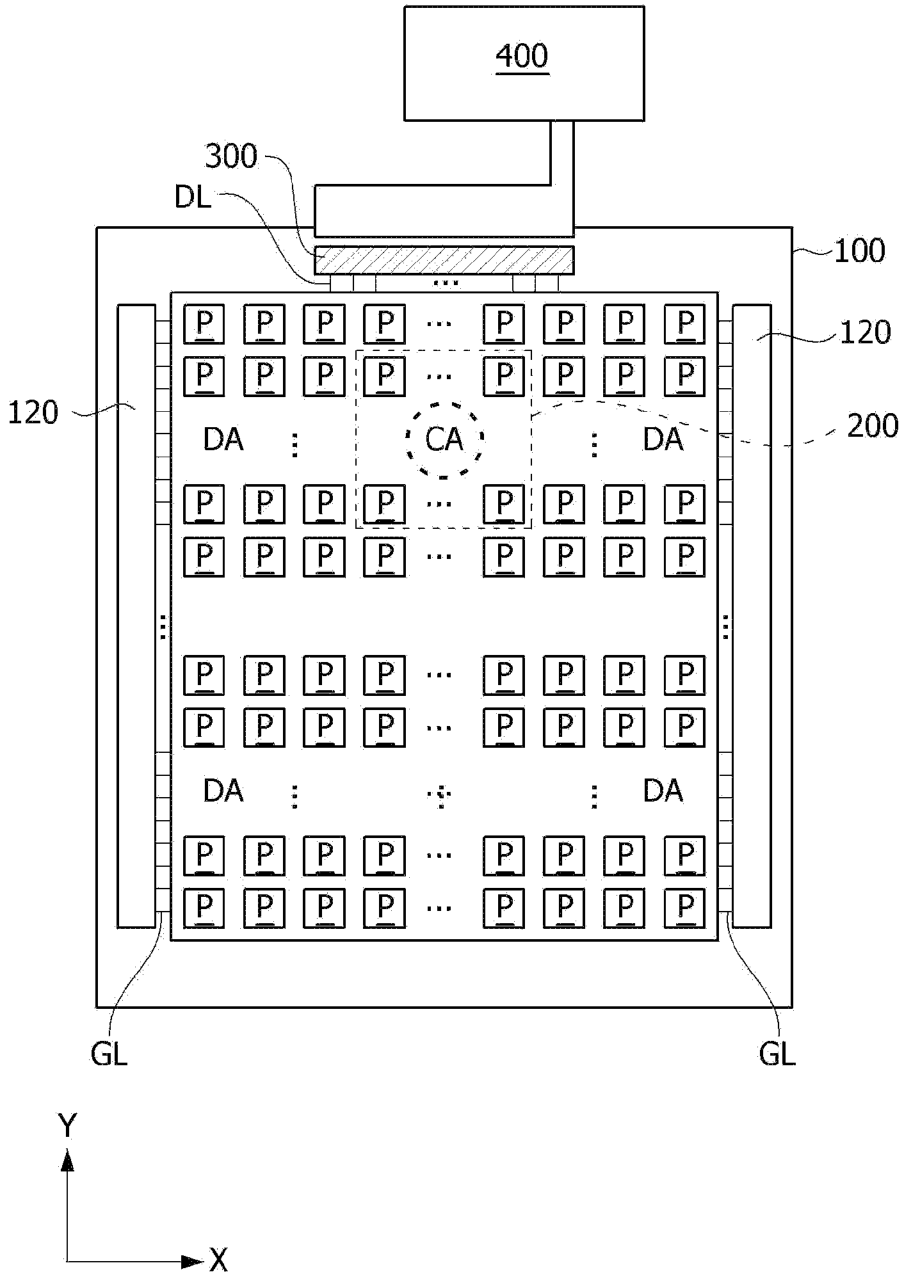
FIG. 6 is an example of a diagram illustrating a display panel and a display panel driver according to an exemplary aspect of the present disclosure.

FIG. 6 is an example of a diagram illustrating a display panel and a display panel driver according to an exemplary aspect of the present disclosure.

Referring to FIG. 6, the display device may include a display panel 100 having a pixel array disposed on a screen, a display panel driver, and the like.

The pixel array of the display panel 100 may include data lines DL, gate lines GL crossing the data lines DL, and pixels P connected to data lines DL and the gate lines GL and arranged in a matrix form. The pixel array may further include power wirings such as VDD line PL1, Vini line PL2, and VSS line PL3 shown in FIG. 7.

The pixel array may be divided into a circuit layer 12 and a light-emitting element layer 14 as shown in FIG. 3. Further, a touch sensor array may be disposed on the light-emitting element layer 14. Here, each of the pixels of the pixel array may include two to four sub-pixels as described above. Each of the sub-pixels may include a pixel circuit disposed on the circuit layer 12.

A screen on which an input image is reproduced on the display panel 100 may include a display area DA and an imaging area CA.

Each of the sub-pixels of the display area DA and the imaging area CA may include a pixel circuit. The pixel circuit may include a driving element for supplying current to the light-emitting element OLED, a plurality of switch elements for sampling the threshold voltage of the driving element and switching the current path of the pixel circuit, a capacitor for maintaining the gate voltage of the driving element, and the like. In this case, the pixel circuit may be disposed below the light-emitting element.

The imaging area CA may include a light-transmission area AG disposed between pixel groups and a camera module disposed under the imaging area CA. The camera module photoelectrically may convert light incident through the imaging area CA in imaging mode using an image sensor, convert pixel data of an image outputted from the image sensor into digital data, and output captured image data.

The display panel driver may write pixel data of an input image into the pixels P. The pixels P may be interpreted as a pixel group including a plurality of sub-pixels.

The display panel driver may include a data driver that supplies a data voltage of pixel data to the data lines DL and a gate driver 120 that sequentially supplies gate pulses to the gate lines GL. Further, the data driver may be integrated into the drive IC 300. In addition, the display panel driver may further include a touch sensor driver not shown in the drawings.

The drive IC 300 may be bonded on the display panel 100. The drive IC 300 receives pixel data of an input image and a timing signal from the host system 400, supplies a data voltage of the pixel data to pixels, and synchronizes the data driver 306 and the gate driver 120.

The drive IC 300 may be connected to the data lines DL through data output channels to supply data voltages of pixel data to the data lines DL. The drive IC 300 may output a gate timing signal for controlling the gate driver 120 through gate timing signal output channels.

The gate driver 120 may include a shift register formed on a circuit layer of the display panel 100 together with a pixel array. The shift register of the gate driver 120 may sequentially supply gate signals to the gate lines GL under the control of the timing controller. The gate signal may include a scan pulse and an EM pulse of an emission signal.

The host system 400 may be implemented with an application processor (AP). The host system 400 may transmit pixel data of an input image to the drive IC 300 through a mobile industry processor interface (MIPI). The host system 400 may be connected to the drive IC 300 through a flexible printed circuit, for example, a flexible printed circuit (FPC).

In addition, the display panel 100 may be implemented with a flexible panel applicable to a flexible display.

The flexible panel may be made of a so-called "plastic OLED panel". The plastic OLED panel may include a back plate and a pixel array on an organic thin film adhered on the back plate. A touch sensor array may be formed over the pixel array.

The back plate may be a polyethylene terephthalate (PET) substrate. The pixel array and the touch sensor array may be formed on the organic thin film. The back plate may block moisture permeation toward the organic thin film so that the pixel array is not exposed to humidity.

The organic thin film may be a polyimide (PI) substrate. A multi-layered buffer film may be formed on the organic thin film with an insulating material (not shown). Further, the circuit layer 12 and the light-emitting element layer 14 may be stacked on the organic thin film, but aspects of the present disclosure are not limited thereto.

In the display device of the present disclosure, a pixel circuit and a gate driver disposed on the circuit layer 12 may include a plurality of transistors. The transistors may be implemented with oxide thin film transistors (TFTs) including an oxide semiconductor including low temperature poly silicon (LTPS) TFTs, and the like. In addition each of the transistors may be implemented as a p-channel TFT or an n-channel TFT. For example, the material of the oxide semiconductor may include one of indium gallium zinc oxide (IGZO), indium zinc oxide (IZO), indium gallium tin oxide (IGTO), and indium gallium oxide (IGO), but is not limited thereto.

The transistor is a three-electrode element including a gate, a source, and a drain. The source is an electrode that provides carriers to the transistor. The carriers in the transistor may start to flow from the source. The drain is an electrode through which the carriers are discharged from the transistor to the outside.

In the transistor, carriers flow from the source to the drain. In the case of an n-channel transistor, carriers are electrons, and thus a source voltage is lower than a drain voltage so that the electrons flow from the source to the drain. In the n-channel transistor, current flows from the drain to the source.

In the case of a p-channel transistor (PMOS), carriers are holes, and thus a source voltage is higher than a drain voltage so that the holes flow from the source to the drain. In the p-channel transistor, since the holes flow from the source to the drain, current flows from the source to the drain. It is noted that the source and drain of the transistor are not fixed in position. For example, the source and drain are interchangeable depending on the applied voltage. Accordingly, it is not limited by the source and drain of the transistor. In the following description, the source and the drain of the transistor will be referred to as a first electrode and a second electrode.

For an n-type MOSFET (NMOS) where electrons are carriers, the voltage at the source electrode is lower than the voltage at the drain electrode to allow the electrons to flow from the source electrode to the drain electrode. As the electrons flow from the source electrode to the drain electrode in the n-type MOSFET, electric current flows from the drain electrode to the source electrode.

A gate pulse swings between a gate-on voltage and a gate-off voltage. The gate-on voltage is set to be higher than a threshold voltage of the transistor, and the gate-off voltage is set to be lower than the threshold voltage of the transistor.

The transistor is turned on in response to the gate-on voltage, but may be turned off in response to the gate-off voltage. In the case of an n-channel transistor, the gate-on voltage may be a gate-high voltage VGH, and the gate-off voltage may be a gate-low voltage VGL. In the case of a p-channel transistor, the gate-on voltage may be a gate-low voltage VGL, and the gate-off voltage may be a gate-high voltage VGH.

A driving element of the pixel circuit may be implemented with a transistor. The electrical characteristics of the driving element may be required to be uniform among all pixels, but there may be differences between the pixels due to a process variation and element characteristic variation, and the difference may be varied as a display driving time elapses.

To compensate for variations in electrical characteristics of the driving elements, the display device may include an internal compensation circuit and an external compensation circuit. The internal compensation circuit may be added to the pixel circuit in each of the sub-pixels to sample the threshold voltage (Vth) and/or mobility (μ) of the driving element, which varies depending on electrical characteristics of the driving element, and compensate for the change in real time.

The external compensation circuit may transmit a threshold voltage and/or mobility of the driving element sensed through a sensing line connected to each of the sub-pixels to an external compensation part. The compensation part of the external compensation circuit may compensate for a change in electrical characteristics of the driving element by modulating pixel data of an input image by reflecting a sensing result.

A voltage of a pixel that varies depending on electrical characteristics of an external compensation driving element may be sensed and data of an input image in an external circuit based on the sensed voltage may be modulated, such that a deviation in electrical characteristics of a driving element between pixels may be compensated for.

Figure 7:
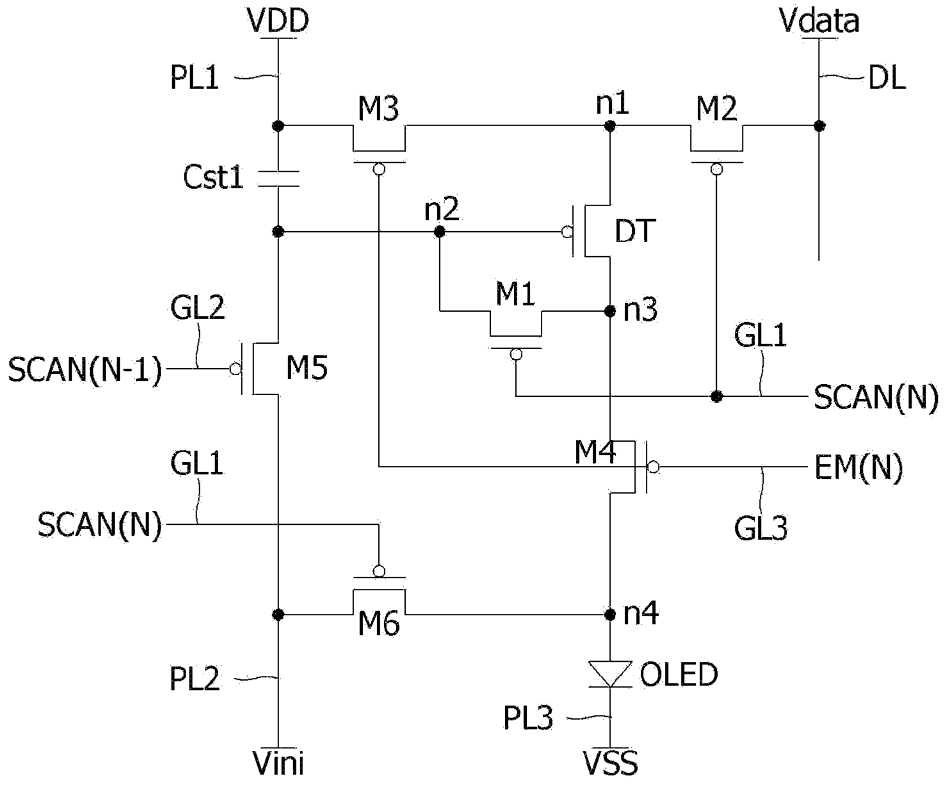
FIG. 7 is an example of a circuit diagram illustrating one example of a pixel circuit.

FIG. 7 is an example of a circuit diagram illustrating one example of a pixel circuit.

The pixel circuit shown in FIG. 7 may be equally applied to the pixel circuits of a display area DA and an imaging area CA.

Referring to FIG. 7, the pixel circuit may include a light-emitting element OLED, a driving element DT for supplying current to the light-emitting element OLED, and an internal compensation circuit for sampling the threshold voltage Vth of the driving element DT and compensating for the gate voltage of the driving element DT by the threshold voltage Vth of the driving element DT using a plurality of switch elements M1 to M6. Each of the driving element DT and the switch elements M1 to M6 may be implemented as a p-channel TFT.

The light-emitting device OLED may include an organic compound layer formed between an anode and a cathode. The organic compound layer may include, but is not limited to, a hole injection layer (HIL), a hole transport layer (HTL), a light-emitting layer (EML), an electron transport layer (ETL), an electron injection layer (EIL), and the like. When a voltage is applied to the anode and cathode electrodes of the OLED, holes passing through the hole transport layer (HTL) and electrons passing through the clectron transport layer (ETL) are moved to the light-emitting layer (EML to form excitons, the visible light may be emitted from the light-emitting layer (EML).

The anode electrode of the light-emitting element OLED may be connected to a fourth node n4 between the fourth and sixth switch elements M4 and M6. The fourth node n4 may be connected to the anode of the light-emitting element OLED, a second electrode of the fourth switch element M4, and a second electrode of the sixth switch element M6. The cathode electrode of the light-emitting element OLED may be connected to VSS line PL3 to which the low potential power supply voltage VSS is applied. The light-emitting element OLED may emit light with the current Ids flowing depending on the gate-source voltage Vgs of the driving element DT. A current path of the light-emitting element OLED may be switched by the third and fourth switch elements M3 and M4.

A storage capacitor Cst1 may be connected between the VDD line PL1 and the first node n1. A data voltage Vdata compensated for by the threshold voltage Vth of the driving element DT may be charged in the storage capacitor Cst1. Since the data voltage Vdata in cach of the sub-pixels is compensated for by the threshold voltage Vth of the driving element DT, a characteristic deviation of the driving element DT in the sub-pixels may be compensated for.

The first switch element M1 may be turned on in response to a gate-on voltage VGL of an N-th scan pulse SCAN(N) to connect the second node n2 and the third node n3. The second node n2 may be connected to a gate electrode of the driving element DT, a first electrode of the storage capacitor Cst1, and a first electrode of the first switch element M1. The third node n3 may be connected to the second electrode of the driving element DT, the second electrode of the first switch element M1, and a first electrode of the fourth switch element M4. The gate electrode of the first switch element M1 is connected to a first gate line GL1 to receive the N-th scan pulse SCAN(N). The first electrode of the first switch element M1 may be connected to the second node n2, and the second electrode of the first switch element M1 may be connected to the third node n3.

The first switch element M1 may be turned on only during one very short horizontal period (1H) in which the Nth scan signal SCAN(N) is generated as the gate-on voltage VGL in one frame period and maintains a turned-off state for approximately one frame period. For this reason, a leakage current may be generated in the turned-off state of the first switch element M1.

The second switch element M2 may be turned on in response to the gate-on voltage VGL of the N-th scan pulse SCAN(N) to supply the data voltage Vdata to the first node n1. The gate electrode of the second switch element M2 is connected to the first gate line GL1 to receive the N-th scan pulse SCAN(N). A first electrode of the second switch element M2 may be connected to the first node n1. The second electrode of the second switch element M2 may be connected to the data line DL to which the data voltage Vdata is applied. The first node n1 may be connected to the first electrode of the second switch element M2, the second electrode of the third switch element M3, and the first electrode of the driving element DT.

The third switch element M3 may be turned on in response to the gate-on voltage VGL of the light-emitting signal EM(N) to connect the VDD line PL1 to the first node n1. The gate electrode of the third switch element M3 may be connected to the third gate line GL3 to receive the light-emitting signal EM(N). A first electrode of the third switch element M3 may be connected to the VDD line PL1. A second electrode of the third switch element M3 may be connected to the first node n1.

The fourth switch element M4 may be turned on in response to the gate-on voltage VGL of the light-emitting signal EM(N) to connect the third node n3 to the anode of the light-emitting element OLED. The gate electrode of the fourth switch element M4 is connected to the third gate line GL3 to receive the light-emitting signal EM(N). The first electrode of the fourth switch element M4 may be connected to the third node n3, and the second electrode thereof may be connected to the fourth node n4.

The fifth switch element M5 may be turned on in response to the gate-on voltage VGL of the N-1th scan pulse SCAN (N-1) to connect the second node n2 to the Vini line PL2. The gate electrode of the fifth switch element M5 is connected to the second gate line GL2 to receive the N-1th scan pulse SCAN(N-1). The first electrode of the fifth switch element M5 may be connected to the second node n2, and the second electrode thereof may be connected to the Vini line PL2.

The sixth switch element M6 may be turned on in response to the gate-on voltage VGL of the N-th scan pulse SCAN(N) to connect the Vini line PL2 to the fourth node n4. The gate electrode of the sixth switch element M6 is connected to the first gate line GL1 to receive the N-th scan pulse SCAN(N). A first electrode of the sixth switch element M6 may be connected to the Vini line PL2, and a second electrode thereof may be connected to the fourth node n4.

The driving element DT may drive the light-emitting element OLED by adjusting the current Ids flowing through the light-emitting element OLED depending on the gate-source voltage Vgs. The driving element DT may include a gate connected to the second node n2, a first electrode connected to the first node n1, and a second electrode connected to the third node n3. It is to be noted that although the aspect of FIG. 7 discloses a specific structure of the pixel circuit as an example, the present disclosure is not limited thereto. For example, the pixel circuit of the display device may have various other structures. For example, 3TIC, 4TIC, 5TIC, 3T2C, 4T2C, 5T2C, 6T2C, 7TIC, 7T2C, 8T2C and the like structures are also possible, and more or less transistors and capacitors could be included.

Figure 8:
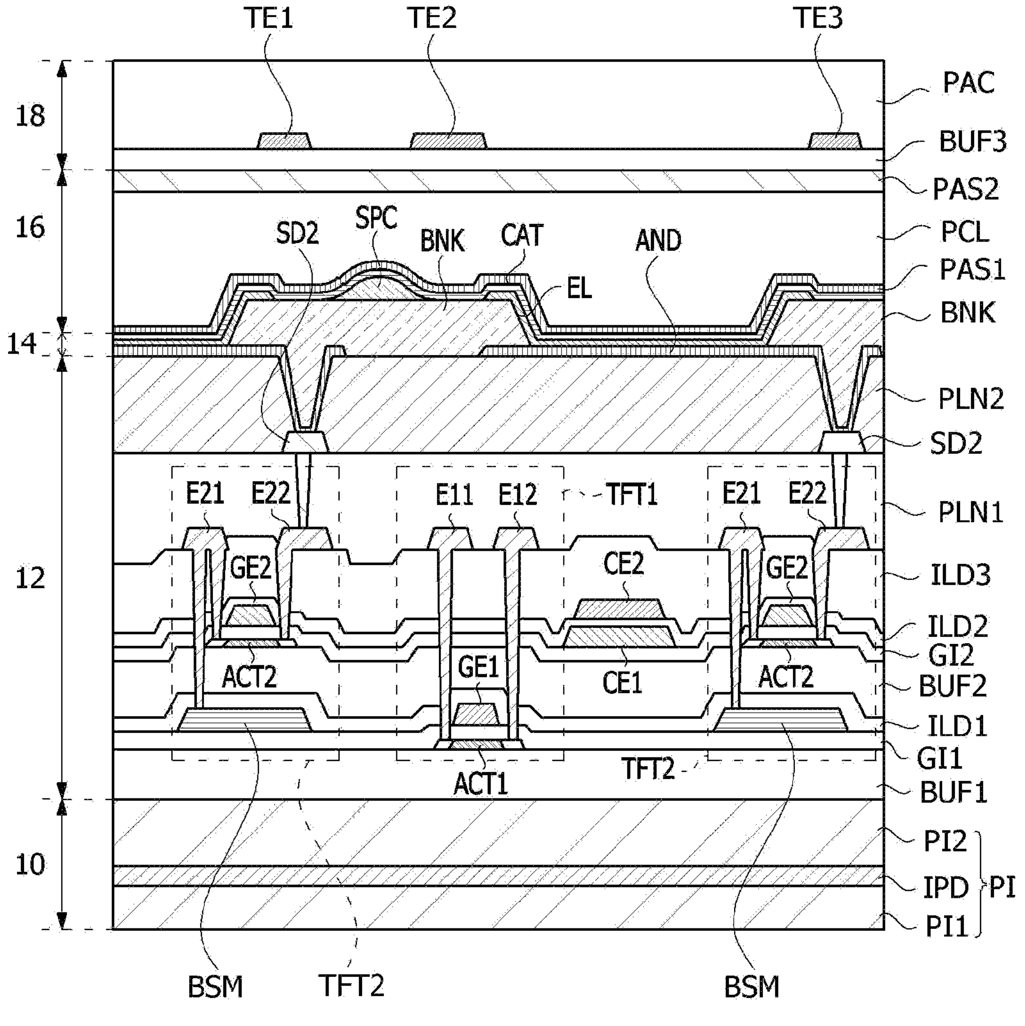
FIG. 8 is an example of a cross-sectional view illustrating in detail a cross-sectional structure of a pixel area disposed in a first display area in a display panel according to an exemplary aspect of the present disclosure.
Figure 9:
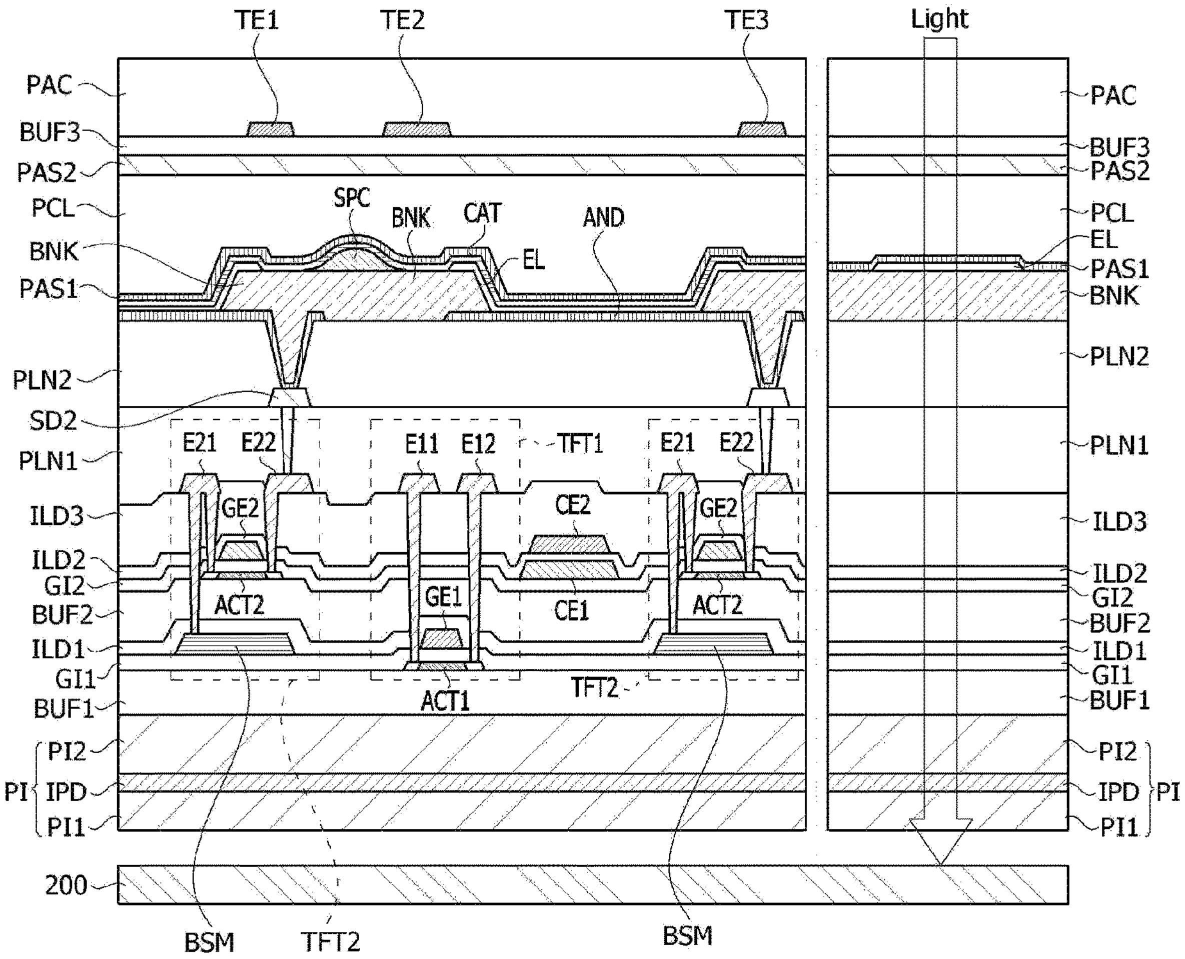
FIG. 9 is an example of a diagram illustrating cross-sectional structures of a pixel area and a light-transmission area disposed in a second display area in a display device according to an exemplary aspect of the present disclosure.

FIG. 8 is a detailed cross-sectional view of a cross-sectional structure of a pixel area disposed in a first display area in a display panel according to an exemplary aspect of the present disclosure, and FIG. 9 is a diagram showing a cross-sectional structure of a pixel area and a light-transmission area disposed in a second display area in the display device according to an exemplary aspect of the present disclosure.

FIG. 8 is a diagram illustrating a cross-sectional structure of a pixel area in a display device according to an exemplary aspect of the present disclosure. Here, it is noted that the cross-sectional structure of the pixel area is not limited to that of FIG. 8. In FIG. 8, TFT represents a driving element DT of the pixel circuit. In detail, "TFT1" is a first TFT that is one of LTPS TFTs disposed in the display area, and "TFT2" is a second TFT that is one of oxide TFTs disposed in the display area.

Referring to FIG. 8, a plurality of sub-pixel circuits and wires connected to the pixel circuits are disposed in the display area DA of the display panel 100. Here, the pixel circuits of the display area include a pixel circuit of a red sub-pixel driving a red light-emitting element, a pixel circuit of a green sub-pixel driving a green light-emitting element, and a pixel circuit of a blue sub-pixel driving a blue light-emitting element. Further, the display area may be separated into a plurality of circuit areas along the X-axis direction of the display panel 100.

The substrate PI may include first and second substrates PI1 and PI2. In addition, an inorganic film IPD may be formed between the first substrate PI1 and the second substrate PI2. In this case the inorganic film IPD blocks moisture permeation. Here, since the substrate PI may be formed of polyimide, it may be referred to as a PI substrate, and the first and second substrates PI1 and PI2 may be referred to as first and second PI substrates.

The first buffer layer BUF1 may be formed on the second substrate PI2. The first buffer layer BUF1 may be formed of a multi-layered insulating layer in which two or more oxide layers $SiO_2$ and nitride layers SiNx are stacked. A first semiconductor layer is formed on the first buffer layer BUF1. The first semiconductor layer may include a poly-silicon semiconductor layer patterned in a photolithography process. The first semiconductor layer may include a poly-silicon active pattern ACT1 forming a semiconductor channel in the first TFT TFT1.

A first gate insulating layer GI1 is deposited on the first buffer layer BUF1 to cover the active pattern ACT1 of the first semiconductor layer. The first gate insulating layer GI1 includes an inorganic insulating material layer. A first metal layer is formed on the first gate insulating layer GI1. The first metal layer is insulated from the first semiconductor layer by the first gate insulating layer GI1.

The first metal layer includes a single metal layer patterned in a photolithography process or metal patterns in which two or more metal layers are stacked. The first metal layer may include the gate electrode GE1 of the first TFT TFT1 and a light shield pattern BSM under the second TFT 2.

A first interlayer insulating layer ILD1 is formed on the first gate insulating layer GI1 to cover the patterns of the first metal layer. The first interlayer insulating layer ILD1 includes an inorganic insulating material. A second buffer layer BUF2 is formed on the first interlayer insulating layer ILD1. The second buffer layer BUF2 includes a single layer or a multi-layer inorganic insulating material. The inorganic insulating material may be such as silicon oxide (SiOx) and silicon nitride (SiNx), but the present disclosure is not limited thereto.

The second semiconductor layer may include an oxide semiconductor pattern ACT2 forming a semiconductor channel in the second TFT TFT2. The second gate insulating layer GI2 is deposited on the second buffer layer BUF2 to cover the active pattern ACT2 of the second semiconductor layer. The second gate insulating layer GI2 includes a single or multi-layered inorganic insulating material. A second metal layer is formed on the second gate insulating layer GI2. The second metal layer is insulated from the second semiconductor layer by the second gate insulating layer GI2.

The second metal layer may include a single metal layer patterned in a photolithography process or metal patterns in which two or more metal layers are stacked. The second metal layer includes a gate electrode GE2 of the second TFT TFT2 and a lower capacitor electrode CE1.

A second interlayer insulating layer ILD2 is formed on the second gate insulating layer GI2 to cover the patterns of the second metal layer. The second interlayer insulating layer ILD2 includes a single layer or a multi-layer inorganic insulating material. A third metal layer is formed on the second interlayer insulating layer ILD2. The third metal layer is insulated from the second metal layer by the second interlayer insulating layer ILD2.

The third metal layer may include a single metal layer patterned in a photolithography process or metal patterns in which two or more metal layers are stacked. The third metal layer includes an upper capacitor electrode CE2. The capacitor Cst of the pixel circuit is composed of the upper capacitor electrode CE2, the lower capacitor electrode CE1, and a dielectric layer therebetween, for example, the second interlayer insulating layer ILD2.

A third interlayer insulating layer ILD3 covering the patterns of the third metal layer is formed on the second interlayer insulating layer ILD2. The third interlayer insulating layer ILD3 includes a single layer or a multi-layer inorganic insulating material. A fourth metal layer is formed on the third interlayer insulating layer ILD3. The fourth metal layer is insulated from the second semiconductor layer by the second gate insulating layer GI2.

A fourth metal layer SD1 may include a single metal layer patterned in a photolithography process or metal patterns in which two or more metal layers are stacked. The fourth metal layer includes first and second electrodes E11 and E12 of the first TFT TFT1 and first and second electrodes E21 and E22 of the second TFT TFT2. The first and second electrodes E11 and E12 of the first TFT TFT1 is connected to a first active pattern ACT1 through a first contact hole passing through the insulating layers GI1, ILD1, BUF2, GI2, ILD2 and ILD3. The first and second electrodes E21 and E22 of the second TFT TFT2 are connected to a second active pattern ACT2 through a second contact hole passing through the insulating layers GI2, ILD2 and ILD3. The first electrode E21 of the second TFT TFT2 may be connected to the light shield pattern BSM through a third contact hole passing through the insulating layers ILD1, BUF2, GI2, ILD2 and ILD3. Here, a strong electric field may be generated in the metal patterns E11 to E22 of the fourth metal layer due to voltages swinging between a gate-on voltage and a gate-off voltage with a large voltage difference.

A first planarization layer PLN1 covers the patterns E11 to E22 of the fourth metal layer. The first planarization layer PLN1 thickly covers the display area DA of the circuit layer 12 with an organic insulating material. When the first planarization layer PLN1 is applied on the circuit layer 12, the organic insulating material flows to the edge of the display panel 100 and covers the side surface of the circuit layer 12 in the bezel area BZ.

A fifth metal layer is formed on the first planarization layer PLN1. The fifth metal layer is insulated from the fourth metal layer by the first planarization layer PLN1. The fifth metal layer includes a single metal layer patterned in a photolithography process or metal patterns in which two or more metal layers are stacked. The fifth metal layer includes a metal pattern SD2 connecting the light-emitting element to the second TFT TFT2. The metal pattern SD2 is connected to the second electrode E22 of the second TFT TFT2 through a fourth contact hole penetrating the first planarization layer PLN1.

A second planarization layer PLN2 is formed on the first planarization layer PLN1 to cover the metal patterns of the fifth metal layer. The second planarization layer PLN2 thickly covers the display area DA of the circuit layer 12 with an organic insulating material. A sixth metal layer is formed on the second planarization layer PLN2. The second planarization layer PLN2 planarizes the surface on which the sixth metal layer is formed.

The sixth metal layer may include a single metal layer patterned in a photolithography process or metal patterns in which two or more metal layers are stacked. The pattern of the sixth metal layer includes an anode electrode AND of the light-emitting device. The anode electrode AND is in contact with the metal pattern SD2 connected to the second TFT TFT2 of the pixel circuits through the fifth contact hole penetrating the second planarization layer PLN2.

In the light-emitting element layer 14, a bank BNK is formed on the second planarization layer PLN2 to cover the edge of the anode AND. In this case, the bank BNK is formed in a pattern that divides a light-emitting area (or an opening area) through which light passes from each pixel to the outside. Accordingly, the bank BNK may be referred to as a pixel-defining film. The bank BNK may be patterned in a photolithography process by including an organic insulating material having photosensitivity. Further, a spacer SPC having a predetermined height may be formed on the bank BNK. In this case, the bank BNK and the spacer SPC may be integrated with the same or substantially same organic insulating material. Further, the spacer SPC secures a gap between a fine metal mask (FMM) and the anode electrode AND so that the FMM is not in contact with the anode electrode AND during a deposition process of the light-emitting device formed of an organic compound.

A seventh metal layer used as a cathode electrode CAT of the light-emitting element is formed on the bank BNK and an organic compound layer EL. The seventh metal layer is connected between sub-pixels in the display area DA. Here, the organic compound layer EL may be referred to as a light-emitting layer or an electroluminescent layer.

The encapsulation layer 16 includes multiple insulating layers covering the cathode electrode CAT of the light-emitting device. The multiple insulating layers include a first inorganic insulating layer PAS1 covering the cathode electrode CAT, a thick organic insulating layer PCL covering the first inorganic insulating layer PAS1, and a second inorganic insulating layer PAS2 covering the organic insulating layer PCL.

The touch sensor layer 18 includes a third buffer layer BUF3 covering the second inorganic insulating layer PAS2, sensor electrode wirings TE1 to TE3 formed on the third buffer layer BUF3, and an organic insulating layer PAC covering the sensor electrode wirings TE1 to TE3.

Referring to FIG. 9, the second display area may include a pixel area and a light-transmission area. Further, the pixel area of the second display area may have the same or substantially same structure as the pixel area shown in FIG. 8, but is not necessarily limited thereto.

The light-transmission area AG may include transparent media having high light transmissivity without metal so that light may be incident with minimal or reduced light loss. The light-transmission area AG may be formed of transparent insulating materials without including metal wirings or pixels. For example, compared to the pixel area, the metal wirings such as the anode electrode AND and the cathode electrode CAT may not be disposed in the light-transmission area AG. Further, the organic compound layer EL may be disposed in the light-transmission area AG. It is to be noted that the specific structure of the display apparatus is not limited to that shown in FIG. 8 or 9. For example, the touch sensor layer 18 may be omitted, and one or more layers shown in FIG. 8 or 9 may also be omitted, changed, or replaced with one or more other layers.

Figure 10:
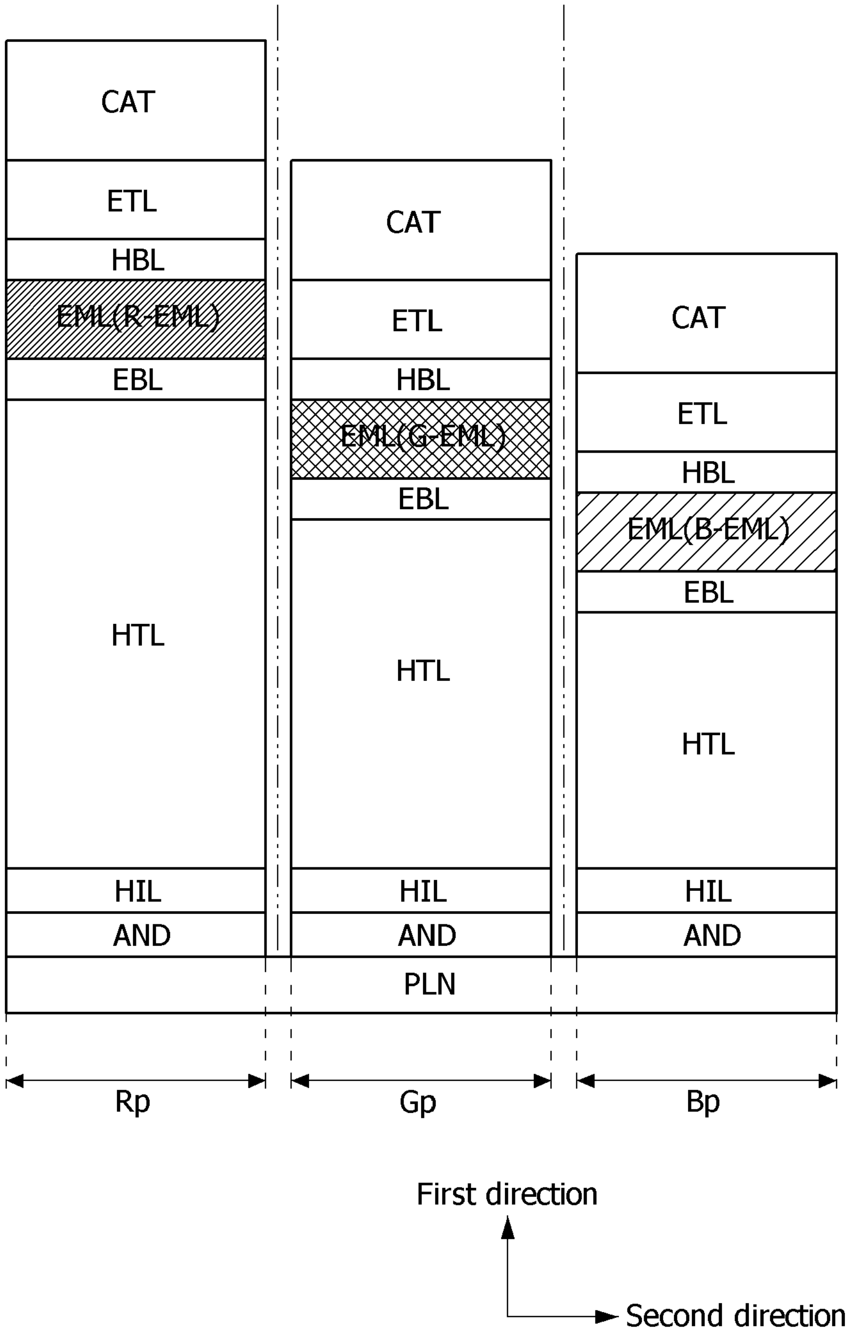
FIG. 10 is an example of a diagram illustrating an organic compound layer of sub-pixels disposed on a first pixel in a display device according to an exemplary aspect of the present disclosure.

FIG. 10 is an example of a diagram illustrating an organic compound layer of sub-pixels disposed on a first pixel in a display device according to an exemplary aspect of the present disclosure. The first direction illustrated in FIG. 10 may be a Z-axis direction, and the second direction may be an X-axis direction or a Y-axis direction. In addition, the second direction may be referred to as a horizontal direction.

Referring to FIG. 10, sub-pixels disposed in a first pixel may include an organic compound layer EL disposed between an anode electrode AND and a cathode electrode CAT. The organic compound layer EL may include a hole injection layer HIL, a hole transport layer HTL, an electron blocking layer EBL, a hole blocking layer HBL, an electron transport layer ETL, and an electron injection layer EIL.

In addition, the sub-pixels disposed in the first pixel may include a red sub-pixel disposed in a red sub-pixel area Rp, a green sub-pixel disposed in a green sub-pixel area Gp, and a blue sub-pixel disposed in a blue sub-pixel area Bp. In addition, a red light-emitting layer R-EML may be disposed in the red sub-pixel area Rp, a green light-emitting layer G-EML may be disposed in the green sub-pixel area Gp, and a blue light-emitting layer B-EML may be disposed in the blue sub-pixel area Bp. In this case, an anode electrode AND of each of the sub-pixels may be disposed on a planarization layer PLN and may be disposed to be overlapped in the second direction. The planarization layer described below may refer to the second planarization layer PLN2 shown in FIG. 9, or a combination of the first and second planarization layers PLN1 and PLN2. However, the present disclosure is not limited thereto.

The hole injection layer HIL may be disposed on the anode electrode AND to facilitate hole injection, and may be formed of at least one selected from the group including 1,4,5,8,9,11-hexaazatriphenylene-hexanitrile (HATCN) and cupper phthalocyanine (CuPc), poly(3,4)-ethylenedioxythiophene (PEDOT), polyaniline (PANI), and N,N-dinaphthyl-N,N'-diphenylbenzidine (NPD), but is not limited thereto.

The hole transport layer HTL may be disposed on the hole injection layer HIL to facilitate hole transport, and may be formed of at least one selected from the group including N,N-dinaphthyl-N,N'-diphenylbenzidine (NPD), N,N'-bis-(3-methylphenyl)-N,N'-bis-(phenyl)-benzidine (TPD), s-TAD and 4,4',4"-Tris(N-3-methylphenyl-N-phenyl-amino)-triphenylamine (MTDATA), but is not limited thereto.

The electron blocking layer EBL may be disposed on the hole transport layer HTL to block the flow of electrons that may be passed to the hole transport layer HTL.

The red light-emitting layer R-EML may include a light-emitting material that emits red light and may be disposed on the electron blocking layer EBL.

The red light-emitting layer R-EML includes a host material including carbazole biphenyl (CBP) or 1,3-bis (carbazol-9-yl (mCP), and may be made of a phosphorescent material including a dopant including at least one selected from the group including PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium), and PtOEP(octacthylporphyrin platinum). Alternatively, it may be made of a fluorescent material containing PBD:Eu(DBM)3(Phen) or perylene, but is not limited thereto.

The green light-emitting layer G-EML may include a light-emitting material that emits green light and may be disposed on the electron blocking layer EBL.

The green light-emitting layer G-EML may include a host material including CBP or mCP, and may be made of a phosphorescent material including a dopant material such as Ir complex containing Ir(ppy)3(fac tris(2-phenylpyridine) iridium). Alternatively, it may be made of a fluorescent material containing Alq3(tris(8-hydroxyquinolino)aluminum), but is not limited thereto.

The blue light-emitting layer B-EML may include a light-emitting material that emits blue light and may be disposed on the electron blocking layer EBL.

The blue light-emitting layer B-EML may include a host material including CBP or mCP, and may be made of a phosphorescent material including a dopant material containing (4,6-F2ppy)2Irpic. In addition, it may be made of a fluorescent material including one of spiro-DPVBi, spiro-6P, distylbenzene (DSB), distryl arylene (DSA), PFO-based polymer and PPV-based polymer, but is not limited thereto.

The hole blocking layer HBL may be disposed on the red light-emitting layer R-EML, the green light-emitting layer G-EML, and the blue light-emitting layer B-EML to block the flow of holes that may be passed to the electron transport layer ETL.

The electron transport layer ETL may be disposed on the hole blocking layer HBL to facilitate electron transport, and may be made of one of Alq3(tris(8-hydroxy-quinolinato) aluminum), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BAlq(bis(2-methyl-80quiolinolate)-4-(phenylphenolato)aluminum), Liq(8-hydroxyquinolinolato-lithium), BMB-3T(5,5'-bis (dimethylboryl)-2,2':5',2"-terthiophenc), PF-6P(perfluoro-2-naphthyl-substituted), TPBi(2,2',2"-(1,3,5-benzinetriyl)-tris(1-phenyl-1-H-benzimidazole), and cyclooctatetracene (COT).

Although not shown in the drawings, the electron injection layer EIL may be additionally disposed on the electron transport layer ETL.

The electron injection layer EIL may use Alq3(tris(8-hydroxyquinolino)aluminum), PBD(2-(4-biphenylyl)-5-(4-tert-butylpheny)-1,3,4oxadiazole), TAZ, spiro-PBD, BAlq, or SAlq, but is not limited thereto.

Figure 11:
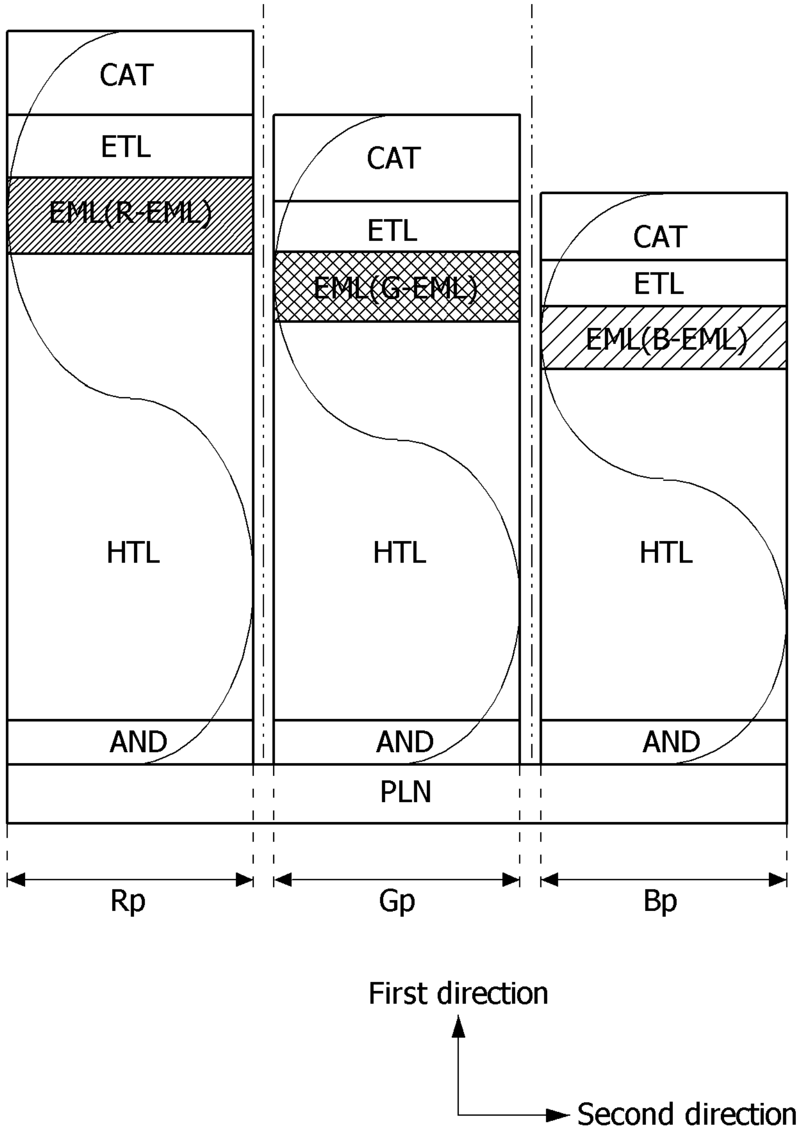
FIG. 11 is an example of a diagram schematically illustrating one example of an arrangement relationship between light-emitting layers and wavelengths of sub-pixels arranged in a first pixel in a display device according to an exemplary aspect of the present disclosure.
Figure 12:
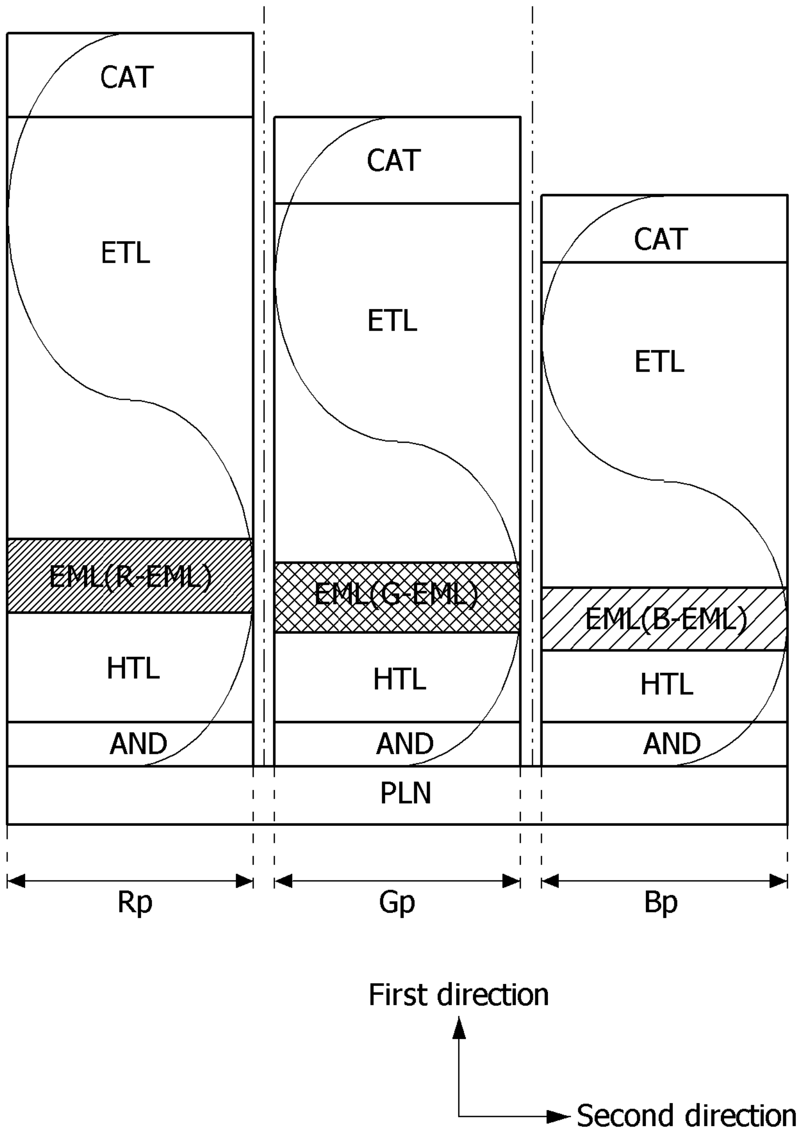
FIG. 12 is an example of a diagram schematically illustrating another aspect of an arrangement relationship between light-emitting layers and wavelengths of sub-pixels disposed in a first pixel in a display device according to an exemplary aspect of the present disclosure.

FIG. 11 is a diagram schematically illustrating an exemplary aspect of an arrangement relationship between light-emitting layers and wavelengths of sub-pixels arranged in a first pixel in a display device according to an exemplary aspect of the present disclosure, and FIG. 12 is a diagram schematically illustrating another aspect of an arrangement relationship between light-emitting layers and wavelengths of sub-pixels disposed in a first pixel in a display device according to an exemplary aspect. The sinusoidal lines shown in FIGS. 11 and 12 may represent wavelengths of light.

In order for each light having a different wavelength in sub-pixels to cause a micro-cavity effect, a distance between an anode electrode AND and a cathode electrode CAT may form an optical distance of a micro-cavity. Here, the optical distance of the micro-cavity may be referred to as a micro-cavity distance.

The micro-cavity distance d may satisfy a condition of $m\lambda=2nd$. Here, m is an order, $\lambda$ is the wavelength of light emitted from each sub-pixel area, and n may mean an average refractive index of a plurality of organic material layers positioned between the anode electrode AND and the cathode electrode CAT in each sub-pixel area. In addition, d may mean a distance between the anode electrode AND and the cathode electrode CAT. Accordingly, repetitive reflection occurs between the anode electrode AND and the cathode electrode CAT, so that the light efficiency of a peak-wavelength may be increased by constructive interference.

For example, when m=1, it is referred to as a light-emitting element having an optical distance of a 1st order, when m=2, it is referred to as a light-emitting element having an optical distance of a 2nd order, and when m=3, it is referred to as a light-emitting element having an optical distance of a 3rd order.

Referring to FIGS. 11 and 12, the sub-pixels disposed in a first pixel may be formed to have an optical distance of the 2nd order. Accordingly, the light-emitting layers of the sub-pixels disposed in the first pixel have two optimal arrangement positions in consideration of the peak-wavelength.

For example, in the sub-pixels disposed in the first pixel, there are at least two positions where the micro-cavity effect is optimal, and each of the light-emitting layers may be positioned in an optimal position by adjusting the thicknesses of the hole injection layer HIL, the hole transport layer HTL, and the electron blocking layer EBL, the hole blocking layer HBL, the electron transport layer ETL, the electron injection layer EIL, and the like, as shown in FIGS. 11 and 12.

Since the sub-pixels disposed in the first pixel are formed in a structure having an optical distance of the 2nd order in the red sub-pixel area Rp, the green sub-pixel area Gp, and the blue sub-pixel area Bp, a thickness of the organic compound layer in the red sub-pixel area Rp is formed thicker than that of the organic compound layer in the green sub-pixel area Gp and the blue sub-pixel area Bp.

Since the sensors 201 and 202 are disposed in the second display area, the sensors 201 and 202 may be affected by light formed in sub-pixels of the second display area.

When a current is injected into a sub-pixel, a green sub-pixel may have a longer delay time relative to other sub-pixels. In addition, since the delayed light emission generated by the long delay time of the green sub-pixel is reflected by the cathode electrode CAT and directed to the sensors 201 and 202, it affects the sensors 201 and 202.

In addition, light directed to the sensors 201 and 202 among the lights generated by the lateral leakage current affects the sensors 201 and 202.

Accordingly, in the display device according to the aspect of the present disclosure, the influence of the delayed light emission on the sensors 201 and 202 may be minimized or reduced by forming the micro-cavity distance of the green sub-pixel to have an optical distance of the 3rd order.

For example, the delayed light emission is related to a capacitance, and the capacitance may be reduced by increasing the thickness of the green organic compound layer through the green sub-pixel having an optical distance of the 3rd order. Here, the thickness of the green organic compound layer may be a distance between an anode electrode and a cathode electrode disposed on one side and the other side of the green organic compound layer.

In addition, in the display device according to the aspect of the present disclosure, the influence of light directed to the sensors 201 and 202 among the lights generated by the lateral leakage current may be further reduced by forming a step difference for an anode electrode disposed on one side of the green organic compound layer relative to an anode electrode disposed on other side of the organic compound layer of a different color. For example, the path of the lateral leakage current may be increased by forming a groove G in a planarization layer PLN and disposing an anode electrode disposed on one side of the green organic compound layer in the groove G. Accordingly, in the display device according to the aspect of the present disclosure, the influence of the lateral leakage current may be reduced through the anode electrode of the green sub-pixel that is disposed to have a step difference. Here, a depth of the groove G may be formed within the range of 1000 Å~1400 Å. In other examples, the groove G may be formed to have a depth within a range of 1100 Å to 1300 Å, or have a depth of about 1200 Å. However, the present disclosure is not limited thereto.

Further, a height difference of each sub-pixel may be maintained like a conventional sub-pixel having an optical distance of the 2nd order by the anode electrode of the green sub-pixel disposed to have a step difference.

Hereinafter, various aspects of a green sub-pixel of a display device according to an exemplary aspect of the present disclosure will be described.

Figure 13:
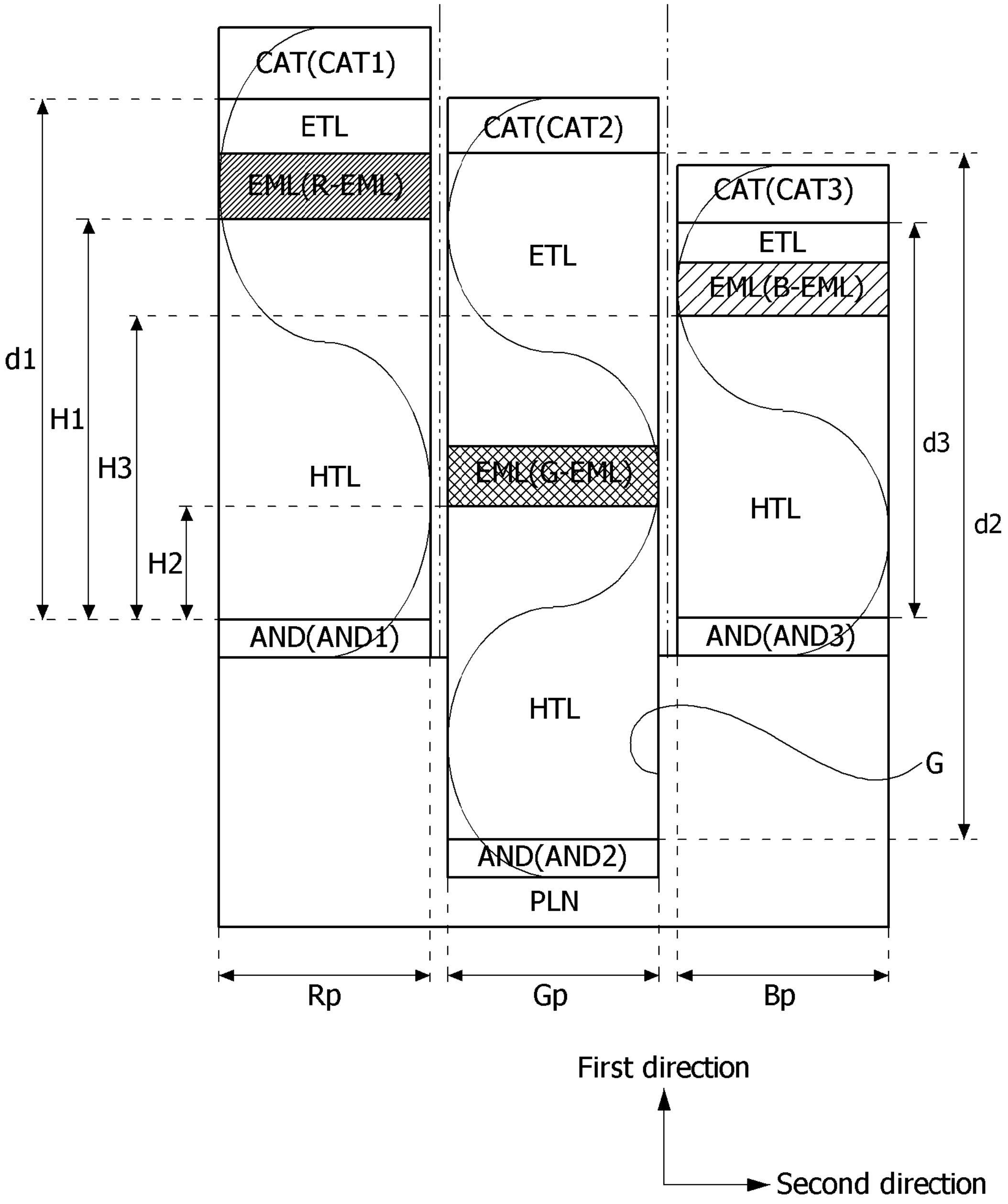
FIG. 13 is an example of a diagram schematically illustrating a first aspect of an arrangement relationship between light-emitting layers and wavelengths of sub-pixels arranged in a second pixel in a display device according to an exemplary aspect of the present disclosure.
Figure 14:
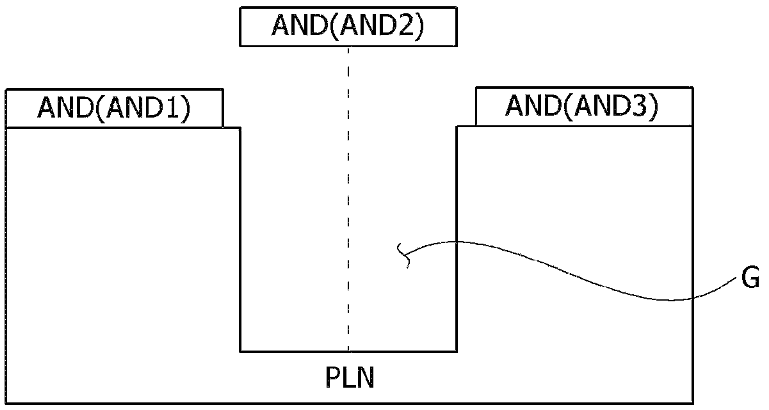
FIG. 14 is an example of a diagram illustrating a groove formed in a planarization layer of a second pixel in a display device according to an exemplary aspect of the present disclosure.
Figure 15:
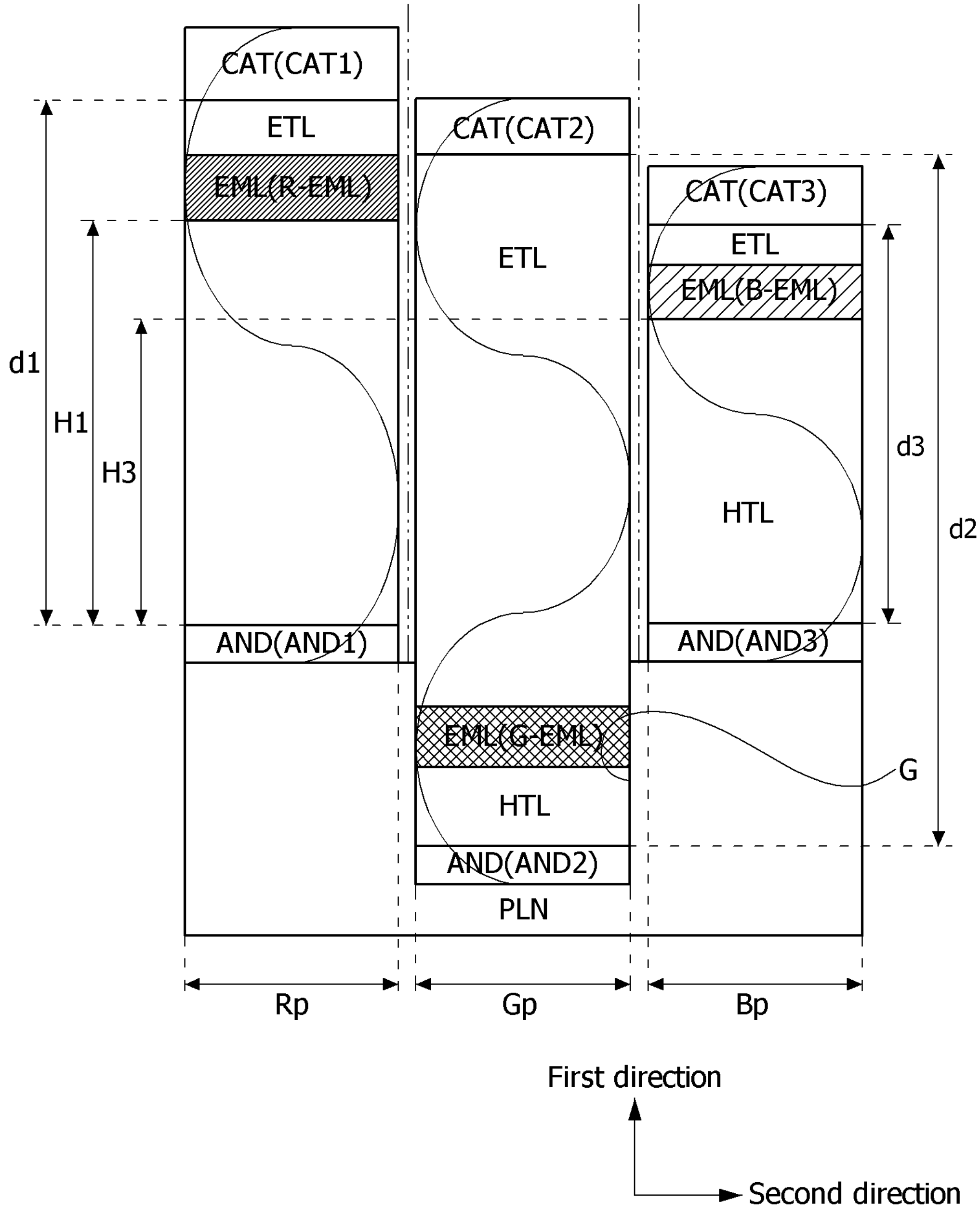
FIG. 15 is an example of a diagram schematically illustrating a second aspect of an arrangement relationship between light-emitting layers and wavelengths of sub-pixels arranged in a second pixel in a display device according to an exemplary aspect of the present disclosure.
Figure 16:
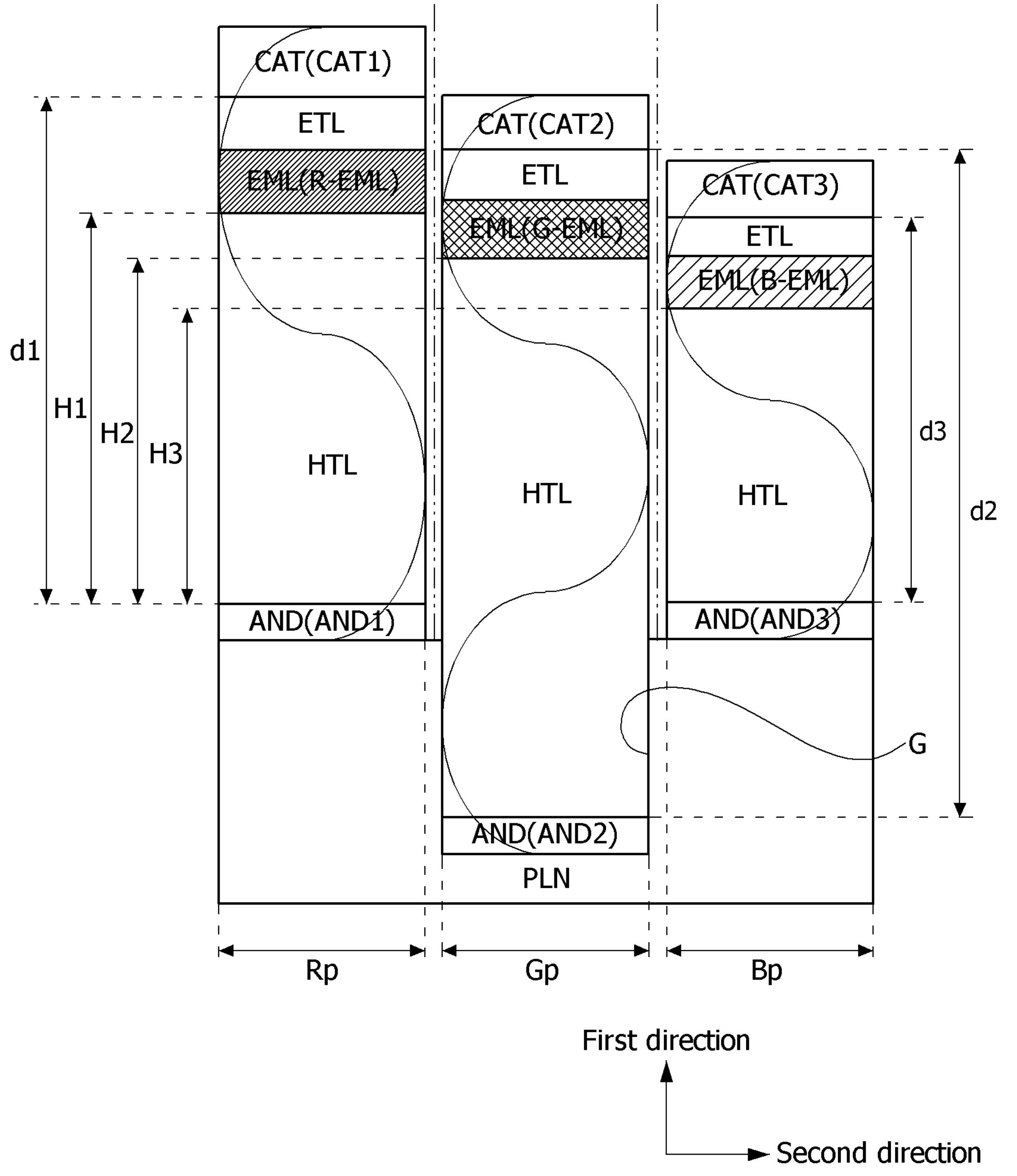
FIG. 16 is an example of a diagram schematically illustrating a third aspect of an arrangement relationship between light-emitting layers and wavelengths of sub-pixels arranged in a second pixel in a display device according to an exemplary aspect of the present disclosure.

FIG. 13 is an example of a diagram schematically illustrating a first aspect of an arrangement relationship between light-emitting layers and wavelengths of sub-pixels arranged in a second pixel in a display device according to an exemplary aspect of the present disclosure, FIG. 14 is a diagram illustrating a groove formed in a planarization layer of a second pixel in a display device according to an exemplary aspect, FIG. 15 is a diagram schematically illustrating a second aspect of an arrangement relationship between light-emitting layers and wavelengths of sub-pixels arranged in a second pixel in a display device according to an exemplary aspect of the present disclosure, and FIG. 16 is a diagram schematically illustrating a third aspect of an arrangement relationship between light-emitting layers and wavelengths of sub-pixels arranged in a second pixel in a display device according to an exemplary aspect of the present disclosure. The sinusoidal lines shown in FIGS. 13, 15, and 16 may represent wavelengths of light.

Referring to FIGS. 13 to 16, in the display device according to an exemplary aspect of the present disclosure, an influence of delayed light emission or the like on the sensors 201 and 202 may be minimized or reduced by applying an optical distance of a 3rd order only to the green sub-pixels disposed in the second display area. Accordingly, since ta micro-cavity distance d2 of the green sub-pixel may satisfy a condition of $3\lambda/2n$, the thickness of the green organic compound layer disposed in the green sub-pixel may be formed larger than that of the organic compound layers of other sub-pixels.

The sub-pixels of the second pixels disposed in the second display area CA of the display device according to an exemplary aspect may include an organic compound layer disposed between the anode electrode and the cathode electrode. In addition, the organic compound layer may include different light-emitting layers for each color.

The sub-pixels disposed in the second pixel may include red sub-pixels disposed in the red sub-pixel area Rp, green sub-pixels disposed in the green sub-pixel area Gp, and blue sub-pixels disposed in the blue sub-pixel area Bp.

Further, the red sub-pixel may include a first anode electrode AND1, a first cathode electrode CAT1, and a red organic compound layer disposed between the first anode electrode AND1 and the first cathode electrode CAT1. In addition, the green sub-pixel may include a second anode electrode AND2, a second cathode electrode CAT2, and a green organic compound layer disposed between the second anode electrode AND2 and the second cathode electrode CAT2. In addition, the blue sub-pixel may include a third anode electrode AND3, a third cathode electrode CAT3, and a blue organic compound layer disposed between the third anode electrode AND3 and the third cathode electrode CAT3.

Further, the red organic compound layer may include one or more of a hole injection layer HIL, a hole transport layer HTL, an electron blocking layer EBL, a hole blocking layer HBL, an electron transport layer ETL, an electron injection layer EIL, and a red light-emitting layer R-EML. In addition, the green organic compound layer may include one or more of a hole injection layer HIL, a hole transport layer HTL, an electron blocking layer EBL, a hole blocking layer HBL, an electron transport layer ETL, an electron injection layer EIL, and a green light-emitting layer G-EML. In addition, the blue organic compound layer may include one or more of a hole injection layer HIL, a hole transport layer HTL, an electron blocking layer EBL, a hole blocking layer HBL, an electron transport layer ETL, an electron injection layer EIL, and a blue light-emitting layer B-EML. However, the present disclosure is not limited thereto, and one or more of the hole injection layer HIL, the hole transport layer HTL, the electron blocking layer EBL, the hole blocking layer HBL, the electron transport layer ETL and the electron injection layer EIL may be omitted from the structure of the organic compound layer.

In addition, a micro-cavity distance d1 of the red sub-pixel may satisfy a condition of $\lambda/n$, and a micro-cavity distance d3 of the blue sub-pixel may also satisfy the condition of $\lambda/n$. In this case, a micro-cavity distance d2 of the green sub-pixel may satisfy a condition of $3\lambda/2n$. Accordingly, a distance between the first anode electrode AND1 and the first cathode electrode CAT1 and between the third anode electrode AND3 and the third cathode electrode CAT3 is λ/n, and a distance between the second anode electrode AND2 and the second cathode electrodes CAT2 is 3λ/2n.

In addition, since the thickness of the green organic compound layer disposed in the green sub-pixel may be formed larger than the thickness of the organic compound layer of the other sub-pixels, in consideration of the thickness and the height difference between the upper sides of the respective sub-pixels, a groove G may be formed concavely in the planarization layer PLN in the first direction. In this case, in the display device according to an exemplary aspect of the present disclosure, the second anode electrode AND2 is disposed in the groove G, so that the green sub-pixel satisfies the micro-cavity distance of the 3rd order, and at the same time, a difference in height of the upper side of each sub-pixel may be maintained like the conventional sub-pixels having the optical distance of the 2nd order. Furthermore, by means of the second anode electrode AND2 disposed inside the groove G, the second anode electrode AND2 may be implemented to have a step difference relative to the first anode electrode AND1 and the third anode electrode AND3, such that the display device according to an exemplary aspect of the present disclosure may further reduce the influence of the lateral leakage current.

In the case of the display device according to the exemplary aspect of the present disclosure, since the optical distance of the 3rd order is applied only to the green sub-pixel, the green light-emitting layer G-EML may be positioned at any one of three optimal positions. Accordingly, the distance between the second anode electrode AND2 and the green light-emitting layer G-EML and the distance between the second cathode electrode CAT2 and the green light-emitting layer G-EML are different for each aspect, and due to the difference, there is also a difference in delayed emission by light generated from the light-emitting layer EML.

Since the optimal position of the green light-emitting layer G-EML may be varied in consideration of delayed emission or the like, each aspect depending on the position of the green light-emitting layer G-EML will be described.

Referring to FIG. 13, the display device according to an exemplary aspect of the present disclosure may include a red sub-pixel, a green sub-pixel according to the first aspect, and a blue sub-pixel. In addition, the green sub-pixel according to the first aspect may include a second anode electrode AND2, a second cathode electrode CAT2, and a green organic compound layer disposed between the second anode electrode AND2 and the second cathode electrode CAT2, and the green organic compound layer may include one or more of a hole transport layer HTL, a green light-emitting layer G-EML, and an electron transport layer ETL.

In addition, a first anode electrode AND1 of the red sub-pixel and a third anode electrode AND3 of the blue sub-pixel may be disposed to overlap with on the same or substantially same horizontal plane in the second direction. However, the present disclosure is not limited thereto. For example, the first anode electrode AND1 of the red sub-pixel and the third anode electrode AND3 of the blue sub-pixel may be disposed to be partially overlapped in the second direction such that there is a height difference between the first anode electrode AND1 and the third anode electrode AND3.

In addition, the second anode electrode AND2 may be disposed inside a groove G of a planarization layer PLN to have a step difference relative to the first anode electrode AND1 and the third anode electrode AND3. Accordingly, the second anode electrode AND2 may be disposed to be spaced apart from the first anode electrode AND1 and the third anode electrode AND3 in the first direction. For example, the second anode electrode AND2 may be disposed closer to the substrate 10 than the first anode electrode AND1 and the third anode electrode AND3.

In this case, the green sub-pixel according to the first aspect may be different from the green sub-pixel according to the second exemplary aspect and the green sub-pixel according to the third aspect in that the green light-emitting layer G-EML is disposed to overlap with the hole transport layer HTL of the red sub-pixel and the hole transport layer HTL of the blue sub-pixel in the second direction, the distance between the second anode electrode AND2 and the green light-emitting layer G-EML is the same as or similar to the distance between the second cathode electrode CAT2 and the green light-emitting layer G-EML, and the like.

Accordingly, the second anode electrode AND2 and a portion of the hole transport layer HTL may be disposed inside the groove G, and the hole transport layer HTL of the green organic compound layer may be disposed between the first anode electrode AND1 and the third anode electrode AND3 on the basis of the second direction. In addition, a second height H2 in the first direction from the first anode AND1 to the green light-emitting layer G-EML of the green organic compound layer in the drawing may be formed smaller than a first height H1 of the red light-emitting layer R-EML of the red organic compound layer in the first direction and a third height H3 of the blue light-emitting layer B-EML of the blue organic compound layer in the first direction.

Referring to FIG. 14, the display device according to an exemplary aspect may include a red sub-pixel, a green sub-pixel according to the second aspect, and a blue sub-pixel. Further, the green sub-pixel according to the second aspect may include a second anode electrode AND2, a second cathode electrode CAT2, and a green organic compound layer disposed between the second anode electrode AND2 and the second cathode electrode CAT2, and the green organic compound layer may include a hole transport layer HTL, a green light-emitting layer G-EML, and an electron transport layer ETL.

In addition, a first anode electrode AND1 of the red sub-pixel and a third anode electrode AND3 of the blue sub-pixel may disposed to overlap with on the same or substantially same horizontal plane in the second direction.

In addition, the second anode electrode AND2 may be disposed inside a groove G of a planarization layer PLN (e.g., the second planarization layer PLN2) to have a step difference relative to the first anode electrode AND1 and the third anode electrode AND3. Accordingly, the second anode electrode AND2 may be disposed to be spaced apart from the first anode electrode AND1 and the third anode electrode AND3 in the first direction.

In this case, the green sub-pixel according to the second exemplary aspect is different from the green sub-pixel according to the first aspect and the green sub-pixel according to the third aspect in that the electron transport layer ETL overlaps with the first anode AND1 of the red sub-pixel and the third anode AND3 of the blue sub-pixel in the second direction, the distance between the second anode electrode AND2 and the green light-emitting layer G-EML is smaller than the distance between the second cathode electrode CAT2 and the green light-emitting layer G-EML, and the like.

Accordingly, the second anode electrode AND2, the hole transport layer HTL, the green light-emitting layer G-EML, and a portion of the electron transport layer ETL may be disposed inside the groove G, and the electron transport layer ETL of the green organic compound layer may be disposed between the first anode electrode AND1 and the third anode electrode AND3 on the basis of the second direction. In addition, on the basis of the first anode electrode AND1, the green light-emitting layer G-EML of the green organic compound layer in the drawing may be disposed below the first anode electrode AND1.

Referring to FIG. 15, the display device according to an exemplary aspect may include a red sub-pixel, a green sub-pixel according to the third aspect, and a blue sub-pixel. Further, the green sub-pixel according to the third aspect may include a second anode electrode AND2, a second cathode electrode CAT2, and a green organic compound layer disposed between the second anode electrode AND2 and the second cathode electrode CAT2. The green organic compound layer may include a hole transport layer HTL, a green light-emitting layer G-EML, and an electron transport layer ETL.

In addition, the first anode electrode AND1 of the red sub-pixel and the third anode electrode AND3 of the blue sub-pixel may be disposed to overlap with on the same or substantially same horizontal plane in the second direction.

In addition, the second anode electrode AND2 may be disposed inside the groove G of the planarization layer PLN to have a step difference relative to the first anode electrode AND1 and the third anode electrode AND3. Accordingly, the second anode electrode AND2 may be disposed to be spaced apart from the first anode electrode AND1 and the third anode electrode AND3 in the first direction.

In this case, the green sub-pixel according to the third aspect may be different from the green sub-pixel and the green sub-pixel according to the first aspect and the green sub-pixel and the green sub-pixel according to the second aspect in that the green light-emitting layer G-EML is disposed to overlap with the hole transport layer HTL of the red sub-pixel and the electron transport layer ETL of the blue sub-pixel in the second direction, the distance between the second anode electrode AND2 and the green light-emitting layer G-EML is larger than the distance between the second cathode electrode CAT2 and the green light-emitting layer G-EML, and the like Accordingly, the second anode electrode AND2 and a portion of the hole transport layer HTL may be disposed inside the groove G, and the hole transport layer HTL of the green organic compound layer may be disposed between the first anode electrode AND1 and the third anode electrode AND3 on the basis of the second direction. In addition, a second height H2 from the first anode AND1 to the green light-emitting layer G-EML of the green organic compound layer in the first direction in the drawing may be formed smaller than a first height H1 of the red light-emitting layer R-EML of the red organic compound layer in the first direction and may be formed larger than a third height H3 of the blue light-emitting layer B-EML of the blue organic compound layer in the first direction.

A brief description of the aspects of the present disclosure described above is as follows.

A display device according to aspects of the present specification may include a display panel configured to include a first display area in which a plurality of first pixels are disposed, and a second display area in which a plurality of second pixels and a light-transmission area between the second pixels are disposed; and a sensor disposed corresponding to the second display area, wherein the second pixel may include a plurality of sub-pixels, the plurality of sub-pixels may include a red sub-pixel including a red organic compound layer disposed between a first anode electrode and a first cathode electrode, a green sub-pixel including a green organic compound layer disposed between a second anode electrode and a second cathode electrode, and a blue sub-pixel including a blue organic compound layer disposed between a third anode electrode and a third cathode electrode, and a thickness of the green organic compound layer may be larger than thicknesses of the organic compound layer of the red sub-pixel and the organic compound layer of the blue sub-pixel.

A display device according to aspects of the present specification may include a display panel configured to include a first display area in which a plurality of first pixels are disposed, and a second display area in which a plurality of second pixels and a light-transmission area between the second pixels are disposed; and a sensor disposed corresponding to the second display area, the second pixel may include a plurality of sub-pixels, the plurality of sub-pixels may include a red sub-pixel including a red organic compound layer disposed between a first anode electrode and a first cathode electrode, and a green sub-pixel including a green organic compound layer disposed between a second anode electrode and a second cathode electrode, a blue sub-pixel including a blue organic compound layer disposed between a third anode electrode and a third cathode electrode, a distance between the first anode electrode and the first cathode electrode may be $\lambda/n$, a distance between the second anode electrode and the second cathode electrode may be $3\lambda/2n$, and $\lambda$ may be a wavelength of light emitted from each sub-pixel, and n may be the average refractive index of the organic compound layer disposed in each sub-pixel.

In the display device according to aspects of the present specification, a distance between the third anode electrode and the third cathode electrode may be $\lambda/n$.

In the display device according to aspects of the present specification, a distance between the anode electrode and the cathode electrode of each of the plurality of sub-pixels disposed in the first pixel may be $\lambda/n$.

In the display device according to aspects of the present specification, the second anode electrode disposed on one side of the green organic compound layer may be disposed to be spaced apart from the first anode electrode disposed on one side of the red organic compound layer in a first direction.

In the display device according to aspects of the present specification, the first anode electrode may overlap with the third anode electrode disposed on one side of the blue organic compound layer in a second direction.

In the display device according to aspects of the present specification, an electron transport layer or a hole transport layer of the green sub-pixel may be disposed between the first anode electrode and the third anode electrode.

In the display device according to aspects of the present specification, a height of the green organic compound layer from the first anode electrode to the green light-emitting layer in the first direction is smaller than a height of each of the red light-emitting layer of the red organic compound layer and the blue light-emitting layer of the blue organic compound layer in the first direction.

In the display device according to aspects of the present specification, a height of the green organic compound layer from the first anode electrode to the green light-emitting layer in the first direction may be smaller than a height of the red light-emitting layer of the red organic compound layer in the first direction, and may be larger than a height of the blue light-emitting layer of the blue organic compound layer in the first direction.

In the display device according to aspects of the present specification, the planarization layer of the display panel may include a concave groove, and a second anode electrode may be disposed inside the groove.

In the display device according to aspects of the present specification, a hole transport layer of the green sub-pixel may be further disposed inside the groove.

In the display device according to aspects of the present specification, a green light-emitting layer is further disposed within the groove.

In the display device according to aspects of the present specification, the sensor may be an infrared sensor.

A display device according to aspects of the present specification may include a display panel configured to include a first display area in which a plurality of first pixels are disposed, and a second display area in which a plurality of second pixels and a light-transmission area between the second pixels are disposed; and a sensor disposed corresponding to the second display area, wherein the second pixel may include a plurality of sub-pixels, the plurality of sub-pixels may include a red sub-pixel including a red organic compound layer disposed between a first anode electrode and a first cathode electrode, a green sub-pixel including a green organic compound layer disposed between a second anode electrode and a second cathode electrode, and a blue sub-pixel including a blue organic compound layer disposed between a third anode electrode and a third cathode electrode, and the second anode electrode disposed on one side of the green organic compound layer may be disposed to be spaced apart from the first anode electrode disposed on one side of the red organic compound layer in a first direction.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:

a display panel including a first display area in which a plurality of first pixels are disposed, and a second display area in which a plurality of second pixels and a light-transmission area between two adjacent second pixels along the plurality of second pixels are disposed; and a sensor disposed corresponding to the second display area, wherein each of the plurality of second pixels includes a plurality of sub-pixels, wherein the plurality of sub-pixels include at least a red sub-pixel including a red organic compound layer disposed between a first anode electrode and a first cathode electrode, a green sub-pixel including a green organic compound layer disposed between a second anode electrode and a second cathode electrode, and a blue sub-pixel including a blue organic compound layer disposed between a third anode electrode and a third cathode electrode, and wherein the green organic compound layer has a thickness larger than a thickness of each of the red organic compound layer and the blue organic compound layer.

2. The display device according to claim 1, wherein the second anode electrode is spaced apart from the first anode electrode or the third anode electrode in a first direction perpendicular to a surface of the display panel.

3. The display device according to claim 2, wherein the first anode electrode at least partially overlaps with the third anode electrode in a second direction which is different from the first direction.

4. The display device according to claim 3, further comprising an electron transport layer or a hole transport layer of the green sub-pixel disposed to at least partially overlap with the first anode electrode or the third anode electrode in the second direction.

5. The display device according to claim 3, wherein a height of a green light-emitting layer of the green organic compound layer from the first anode electrode in the first direction is smaller than a height of each of a red light-emitting layer of the red organic compound layer and a blue light-emitting layer of the blue organic compound layer in the first direction.

6. The display device according to claim 3, wherein a height of a green light-emitting layer of the green organic compound layer from the first anode electrode in the first direction is smaller than a height of a red light-emitting layer of the red organic compound layer in the first direction, and is larger than a height of a blue light-emitting layer of the blue organic compound layer in the first direction.

7. The display device according to claim 3, wherein a height of the green light-emitting layer of the green organic compound layer in the first direction is smaller than a height of the first anode electrode or the third anode electrode in the first direction.

8. The display device according to claim 1, further comprising a planarization layer disposed under each of the first anode electrode, the second anode electrode and the third anode electrode, wherein the planarization layer includes a concave groove, and the second anode electrode is disposed inside the groove.

9. The display device according to claim 8, wherein a hole transport layer of the green sub-pixel is further disposed inside the groove.

10. The display device according to claim 9, wherein a green light-emitting layer of the green organic compound layer is further disposed inside the groove.

11. The display device according to claim 1, wherein the sensor is an infrared sensor.

12. The display device according to claim 1, wherein a distance between the first anode electrode and the first cathode electrode forms an optical distance of a micro-cavity for the red sub-pixel, a distance between the second anode electrode and the second cathode electrode forms an optical distance of a micro-cavity for the green sub-pixel, and a distance between the third anode electrode and the third cathode electrode forms an optical distance of a micro-cavity for the blue sub-pixel.

* * * * *